United States Patent
Yoon et al.

(10) Patent No.: US 9,247,647 B1
(45) Date of Patent: Jan. 26, 2016

(54) HIGH QUALITY FACTOR INDUCTOR AND HIGH QUALITY FACTOR FILTER IN PACKAGE SUBSTRATE OR PRINTED CIRCUIT BOARD (PCB)

(71) Applicant: QUALCOMM Incorporated, San Diego, CA (US)

(72) Inventors: Jung Ho Yoon, San Diego, CA (US); Xiaonan Zhang, San Diego, CA (US); Jong-Hoon Lee, San Diego, CA (US); Young Kyu Song, San Diego, CA (US); Uei-Ming Jow, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/484,000

(22) Filed: Sep. 11, 2014

(51) Int. Cl.
  *H01L 29/00* (2006.01)
  *H05K 1/18* (2006.01)
  *H01L 23/498* (2006.01)
  *H01L 49/02* (2006.01)
  *H03H 7/01* (2006.01)

(52) U.S. Cl.
  CPC .......... *H05K 1/185* (2013.01); *H01L 23/49816* (2013.01); *H01L 23/49822* (2013.01); *H01L 23/49827* (2013.01); *H01L 23/49838* (2013.01); *H01L 28/40* (2013.01); *H03H 7/1741* (2013.01); *H05K 2201/1003* (2013.01); *H05K 2201/1006* (2013.01); *H05K 2201/10015* (2013.01)

(58) Field of Classification Search
  CPC ..... H01L 21/82; H01L 23/642; H01L 63/645; H01L 23/5221; H01L 23/5227; H01L 23/49589; H01L 23/49883; H01L 23/49575; H01L 23/49827; H01L 23/647; H01L 23/5223; H01L 27/08; H01L 27/0805; H01L 27/0248; H01L 27/0664; H01L 27/0784; H01L 27/1085; H01L 28/10; H01L 28/20; H01L 28/40
  USPC ......... 257/531, 277, 678, 528, 532, 533, 681, 257/734, 737, 758, E21.006, E21.007, 257/E21.008, E21.264, E21.267, E21.327, 257/E21.508, E21.509, E21.499
  See application file for complete search history.

(56) References Cited

U.S. PATENT DOCUMENTS 6,800,936 B2  10/2004  Kosemura et al.
7,348,661 B2 *  3/2008  Kim et al. ..................... 257/678

(Continued)

OTHER PUBLICATIONS

International Search Report and Written Opinio—PCT/US2015/049238—ISA/EPO—Nov. 12, 2015.

*Primary Examiner* — David Nhu
(74) *Attorney, Agent, or Firm* — Loza & Loza, LLP

(57) ABSTRACT

A package substrate (or printed circuit board) that includes at least one dielectric layer, a first inductor structure is at least partially located in the dielectric layer, a third interconnect, and a second inductor structure. The first inductor structure includes a first interconnect, a first via coupled to the first interconnect, and a second interconnect coupled to the first via. The third interconnect is coupled to the first inductor structure. The third interconnect is configured to provide an electrical path for a ground signal. The second inductor structure is at least partially located in the dielectric layer. The second inductor is coupled to the third interconnect. The second inductor structure includes a fourth interconnect, a second via coupled to the fourth interconnect, and a fifth interconnect coupled to the second via. The first and second inductor structures are configured to operate with a capacitor as a $3^{rd}$ harmonic suppression filter.

28 Claims, 29 Drawing Sheets

(56) References Cited

U.S. PATENT DOCUMENTS

| | | |
|---|---|---|
| 8,134,425 B2 | 3/2012 | Rofougaran et al. |
| 8,399,961 B2 * | 3/2013 | Yen et al. ............ 257/531 |
| 8,660,434 B2 | 2/2014 | Kagaya et al. |
| 8,941,212 B2 * | 1/2015 | Yen et al. ............ 257/528 |
| 2008/0079139 A1 | 4/2008 | Ye et al. |
| 2011/0069470 A1 | 3/2011 | Bong et al. |
| 2011/0149519 A1 | 6/2011 | Choudhury et al. |
| 2012/0161279 A1 | 6/2012 | Lin et al. |
| 2013/0048365 A1 | 2/2013 | Kim et al. |

\* cited by examiner

HIGH QUALITY FACTOR INDUCTOR AND HIGH QUALITY FACTOR FILTER IN PACKAGE SUBSTRATE OR PRINTED CIRCUIT BOARD (PCB)

BACKGROUND

1. Field

Various features relate to a high quality factor inductor and/or high quality factor filter in a package substrate or printed circuit board (PCB).

2. Background

Inductors that are located in integrated circuit (IC) packages are limited in their capabilities for supporting high current due to the limited real estate in IC packages. Specifically, since these inductors are located in the IC, the size of these inductors is limited by the size of the IC. As a result of the restricted space in the IC, these inductors typically have a high resistance and a low quality (Q) factor. FIG. 1 conceptually illustrates a semiconductor device that includes an inductor. Specifically, FIG. 1 illustrates a die 100, a packaging substrate 102, a set of solder balls 104, a printed circuit board (PCB) 106, and an inductor 108. As shown in FIG. 1, the die 100 is coupled to the packaging substrate 102. The packaging substrate 102 is coupled to the PCB 106 through the set of solder balls 104. The inductor 108 is defined and located in the die 100.

FIG. 1 also illustrates that some solder balls have been omitted/removed in a region near the inductor 108. This is because solder balls can affect/disrupt the performance of an inductor. More specifically, solder balls that are near an inductor can disrupt the magnetic flux of an inductor, resulting in a low inductance and low Q factor for the inductor, which is why solder balls are removed in a region near an inductor. However, removing solder balls between a packaging substrate and a PCB can affect the structural stability of the packaging substrate and the PCB. Thus, current IC design must weigh the benefit of removing solder balls (e.g., better inductance and Q factor inductor) versus the disadvantage of removing solder balls (e.g., less stable packaging substrate/ PCB structure), when determining how many solder balls to use and where to put solder balls when coupling a die and packaging substrate to a PCB.

Therefore, there is a need for an improved inductor design for integrated devices. Ideally, such an inductor will have better inductance performance, lower resistance and better quality factor value, without having to sacrifice the structural stability of the semiconductor device. Moreover, such an inductor may be used as part of a filter with a high quality factor value.

SUMMARY

Various features, apparatus and methods described herein provide a high quality factor inductor and/or high quality factor filter in a package substrate or printed circuit board (PCB).

A first example provides a package substrate that includes at least one dielectric layer, a first inductor structure at least partially located in the dielectric layer, a third interconnect coupled to the first inductor structure, and a second inductor structure at least partially located in the dielectric layer. The second inductor is coupled to the third interconnect. The third interconnect is configured to provide an electrical path for a ground signal. The first inductor structure includes a first interconnect, a first via coupled to the first interconnect, and a second interconnect coupled to the first via. The second inductor structure includes a fourth interconnect, a second via coupled to the fourth interconnect, and a fifth interconnect coupled to the second via.

According to an aspect, the first inductor structure and the second inductor structure are inductor structures from a plurality of inductor structures in the package substrate, the plurality of inductor structures arranged in an array configuration.

According to an aspect, the first inductor structure includes a first solder ball.

According to an aspect, the first and second inductor structures are configured to operate with a capacitor as a filter. The filter is one of at least a suppression filter, and/or a $3^{rd}$ harmonic suppression filter. The capacitor is a capacitor located in an integrated device that is coupled to the package substrate.

According to an aspect, the third interconnect is part of the second interconnect and the fifth interconnect.

According to an aspect, the first inductor structure and the second inductor structure, individually or collectively, comprises a quality factor of about 20 or more.

According to an aspect, the first inductor structure and the second inductor structure, individually or collectively, comprises a quality factor of about 200 or more.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a package substrate that includes at least one dielectric layer, a first inductive means configured to provide inductance in the package substrate, an interconnect means coupled to the first inductive means, the interconnect means configured to provide an electrical path for a ground signal, and a second inductive means configured to provide inductance in the package substrate. The second inductive means coupled to the interconnect means.

According to an aspect, the first inductive means and the second inductive means are inductive means from a plurality of inductor means in the package substrate, the plurality of inductive means arranged in an array configuration.

According to an aspect, the first and second inductive means structures are configured to operate with capacitive means as a filter. The filter is one of at least a suppression filter, and/or a $3^{rd}$ harmonic suppression filter.

According to an aspect, the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a printed circuit board (PCB) that includes at least one dielectric layer, a first inductor structure at least partially located in the dielectric layer, a third interconnect coupled to the first inductor structure, and a second inductor structure at least partially located in the dielectric layer. The second inductor is coupled to the third interconnect. The third interconnect is configured to provide an electrical path for a ground signal. The first inductor structure includes a first interconnect, a first via coupled to the first interconnect, and a second interconnect coupled to the first via. The second inductor structure includes a fourth interconnect, a second via coupled to the fourth interconnect, and a fifth interconnect coupled to the second via.

According to an aspect, the first inductor structure and the second inductor structure are inductor structures from a plurality of inductor structures in the printed circuit board, the plurality of inductor structures arranged in an array configuration.

According to an aspect, the first inductor structure includes a first solder ball.

According to an aspect, the first and second inductor structures are configured to operate with a capacitor as a filter. The filter is one of at least a suppression filter, and/or a $3^{rd}$ harmonic suppression filter. The capacitor is a capacitor located in an integrated device that is coupled to the printed circuit board.

According to an aspect, the third interconnect is part of the second interconnect and the fifth interconnect.

According to an aspect, the first inductor structure and the second inductor structure, individually or collectively, comprises a quality factor of about 20 or more.

According to an aspect, the first inductor structure and the second inductor structure, individually or collectively, comprises a quality factor of about 200 or more.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fourth example provides a printed circuit board (PCB) that includes at least one dielectric layer, a first inductive means configured to provide inductance in the printed circuit board, an interconnect means coupled to the first inductive means, the interconnect means configured to provide an electrical path for a ground signal, and a second inductive means configured to provide inductance in the printed circuit board. The second inductive means coupled to the interconnect means.

According to an aspect, the first inductive means and the second inductive means are inductive means from a plurality of inductor means in the printed circuit board, the plurality of inductive means arranged in an array configuration.

According to an aspect, the first and second inductive means structures are configured to operate with capacitive means as a filter. The filter is one of at least a suppression filter, and/or a $3^{rd}$ harmonic suppression filter.

According to an aspect, the printed circuit board is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

Figure 1:
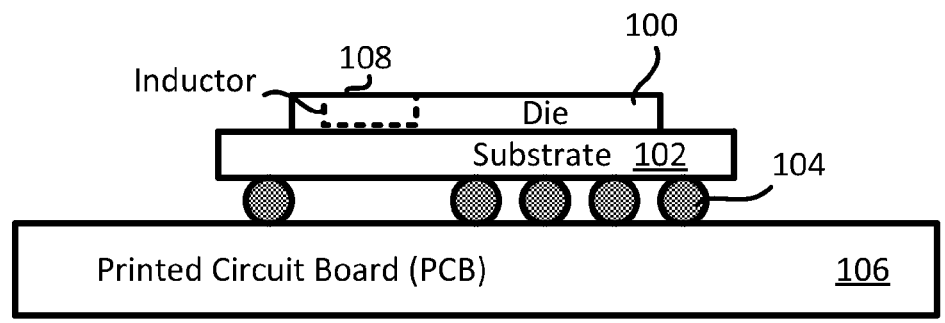
FIG. 1 illustrates a known inductor integrated in a die.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a package substrate (or printed circuit board) that includes at least one dielectric layer, a first inductor structure is at least partially located in the dielectric layer, a third interconnect, and a second inductor structure. The first inductor structure includes a first interconnect, a first via coupled to the first interconnect, and a second interconnect coupled to the first via. The third interconnect is coupled to the first inductor structure. The third interconnect is configured to provide an electrical path for a ground signal. The second inductor structure is at least partially located in the dielectric layer. The second inductor is coupled to the third interconnect. The second inductor structure includes a fourth interconnect, a second via coupled to the fourth interconnect, and a fifth interconnect coupled to the second via. In some implementations, the first inductor structure and the second inductor structure are inductor structures from several inductor structures in the package substrate. The inductor structures arranged in an array configuration. In some implementations, the first inductor structure includes a first solder ball. In some implementations, the first and second inductor structures are configured to operate with a capacitor as a filter. In some implementations, the filter is one of at least a suppression filter, and/or a $3^{rd}$ harmonic suppression filter.

Terms and Definitions

An interconnect is an element or component of a device (e.g., integrated device, integrated package device, die) and/or a base (e.g., package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component.

A redistribution layer (or a redistribution metal layer) is a metal layer of a redistribution portion of an integrated device. A redistribution layer may include one or more redistribution interconnects, which are formed on the same metal layer of the redistribution portion. A redistribution portion of an integrated device may include several redistribution layers, each redistribution layer may include one or more redistribution interconnects. Thus, for example, a redistribution portion may include a first redistribution interconnect on a first redistribution layer, and a second redistribution interconnect on a second redistribution layer that is different than the first redistribution layer.

Exemplary High Quality Factor Inductor and/or High Quality Factor Filter in Package Substrate or Printed Circuit Board (PCB)

Figure 2:
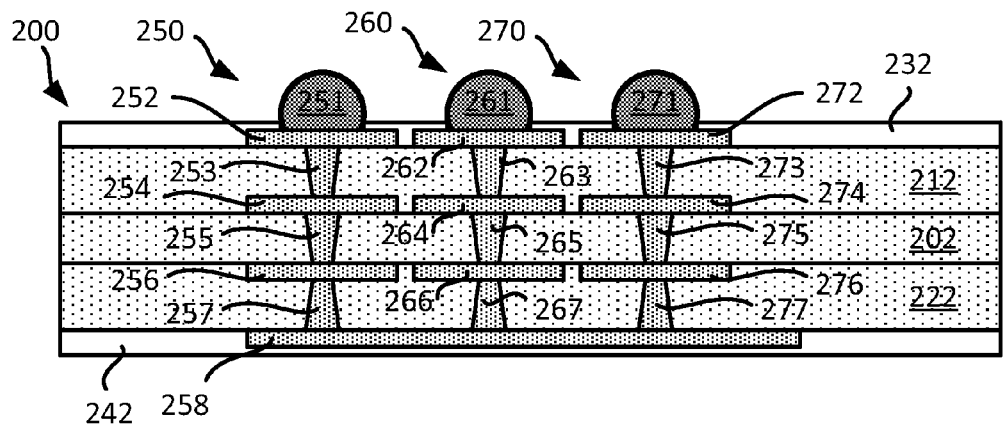
FIG. 2 illustrates a package substrate that includes several inductor structures.

FIG. 2 illustrates a profile view of a packaging substrate 200 that includes one or more inductors. In some implementations, the packaging substrate 200 is an interposer. The packaging substrate 200 includes a first dielectric layer 202, a second dielectric layer 212, a third dielectric layer 222, a first solder resist layer 232, and a second solder resist layer 242.

The package substrate 200 may include a core layer or may be coreless. In some implementations, when the package substrate 200 includes a core layer, the first dielectric layer 202 is a core layer, and the second and third dielectric layers are prepeg layers. In some implementations, when the package substrate 200 is coreless, the first, second and third dielectric layers may be prepeg layers.

The package substrate 200 includes a first inductor structure 250, a second inductor structure 260, and a third inductor structure 270. In some implementations, the first, second and third inductor structures 250, 260, and 270 may collectively be an inductor structure. These inductor structures 250, 260, and/or 270, individually and/or collectively may be an inductive means.

As shown in FIG. 2, the first inductor structure 250 (which may be an inductive means) includes a solder ball 251, a first interconnect 252, a second interconnect 253, a third interconnect 254, a fourth interconnect 255, a fifth interconnect 256, a sixth interconnect 257, and a seventh interconnect 258. The first interconnect 252, the third interconnect 254, the fifth interconnect 256, and the seventh interconnect 258 may be pads and/or traces in/on the package substrate 200. The second interconnect 253, the fourth interconnect 255, and the sixth interconnect 257 may be vias in the package substrate 200.

Similarly, the second inductor structure 260 (which may be another inductive means) includes a solder ball 261, a first interconnect 262, a second interconnect 263, a third interconnect 264, a fourth interconnect 265, a fifth interconnect 266, a sixth interconnect 267, and the seventh interconnect 258. The first interconnect 262, the third interconnect 264, and the fifth interconnect 266 may be pads and/or traces in/on the package substrate 200. The second interconnect 263, the fourth interconnect 265, and the sixth interconnect 267 may be vias in the package substrate 200.

The third inductor structure 270 (which may be another inductive means) includes a solder ball 271, a first interconnect 272, a second interconnect 273, a third interconnect 274, a fourth interconnect 275, a fifth interconnect 276, a sixth interconnect 277, and the seventh interconnect 258. The first interconnect 272, the third interconnect 274, and the fifth interconnect 276 may be pads and/or traces in/on the package substrate 270. The second interconnect 273, the fourth interconnect 275, and the sixth interconnect 277 may be vias in the package substrate 200.

As shown in FIG. 2, the first, second, and third inductor structures 250, 260, and 270 share a common interconnect, namely the seventh interconnect 258. In the example of FIG. 2, the first, second, and third inductor structures 250, 260, and 270 are physically coupled together through the seventh interconnect 258. In some implementations, the seventh interconnect 258 is an interconnect means (e.g., interconnect) that is configured to provide an electrical path for a ground signal. For example, in some implementations, a ground signal (e.g., from a die) may traverse the first inductor structure 250 through the solder ball 251, the first interconnect 252, the second interconnect 253, the third interconnect 254, the fourth interconnect 255, the fifth interconnect 256, the sixth interconnect 257, and to the seventh interconnect 258. The same ground signal may traverse the second and third inductor structures 260 and 270 to the seventh interconnect 258. The seventh interconnect 258 may be a single interconnect, a plate and/or combination of traces and/or pads.

The above exemplary inductors, inductor structures, inductive means that include/integrate solder balls as part of the inductor provide several technical advantages over known inductors (e.g., inductors that do not integrate solder balls). For example, the above exemplary inductors provide better performance/properties than known inductors. Some of the relevant properties of an inductor include effective inductance, Q factor and/or effectiveness of the coupling of the inductor. The effectiveness of an inductor may be defined by its Q factor. A Q factor is a quality factor/value that defines the efficiency of an inductor. A Q factor of an inductor may be defined as the ratio between the reactance of the inductor and the resistance of the inductor (e.g., Q=ωL/R). The higher the Q factor, the closer the inductor approaches the behavior of an ideal inductor, which is a lossless inductor. Thus, generally speaking, a higher Q factor is more desirable than a lower Q factor. In some implementations, the above exemplary inductors have better inductance (L) (e.g., higher inductance), better Q factor (e.g., higher Q factor) and better resistance (R) (e.g., lower resistance).

In some implementations, these inductors have better properties (e.g., better inductance) in that they leverage the height of the solder balls to increase inductance. One benefit of using an inductor that integrates solder balls is that such inductors are capable of supporting high current for high power applications. Moreover, the relatively large size of solder balls (compared to metal layers of the die that are part of the inductor) lowers the resistance of the inductor, which effectively increases the Q factor of the inductor. On a similar note, interconnects (e.g., traces, pads, vias) on a package substrate and/or printed circuit board (PCB) that are part of an inductor are typically larger than metal layers in a die that are part of the inductor. In some implementations, these interconnects (that area part of the inductor) of package substrate or PCB may be about 2 times wider than the metal interconnects/lines (that area part of the inductor) on the die. These wider interconnects have lower resistance than the narrower metal interconnects. Consequently, these wider interconnects lower the overall effective resistance of the inductor. As a result, an inductor that integrate interconnects on the package substrate or PCB as part of the inductor has a better Q factor (because of the lower resistance) than an inductor that is solely in a die.

Moreover, using and keeping the solder balls helps provides/maintain the structural coupling, stability, and/or rigidity of the semiconductor device, while at the same time minimizing, avoiding degradation of the magnetic flux due to solder ball effects. For example, keeping the solder balls helps reduce mechanical stress in the semiconductor device (e.g., package).

In some implementations, the configuration of the first, second, and/or third inductor structures 250, 260, and/or 270 provides one or more inductor or inductor structure with a high quality factor (Q). In some implementations, the quality factor (Q) of the first, second and/or third inductor structures 250, 260 and/or 270 may be about 20 or greater (either collectively or individually). In some implementations, the quality factor (Q) of the first, second and/or third inductor structures 250, 260 and/or 270 may be about 200 or greater (either collectively or individually).

It should be noted that instead of a package substrate, the high quality factor inductor may be integrated in a printed circuit board (PCB) in a similar manner described above.

In addition, the above inductor structures 250, 260 and/or 270 may be implemented or configured with a capacitor to operate as a filter for an electrical signal. In some implementations, the filter is one of at least a trap filter, a notch filter, and/or a $3^{rd}$ harmonic suppression filter. In some implementations, the filter is a high quality factor (Q) filter. Examples of a capacitor and a filter will be further described below in FIGS. 7 and 9-12. Also, in some implementations, the above inductor structures 250, 260, and/or 270 may be implemented with an inductor in an integrated device (e.g., die).

Moreover, the above inductor structures 250, 260 and/or 270 may be implemented or configured with an inductor in a die to further increase the effective quality factor of the integrated device (e.g., die+package substrate, die+PCB).

Figure 3:
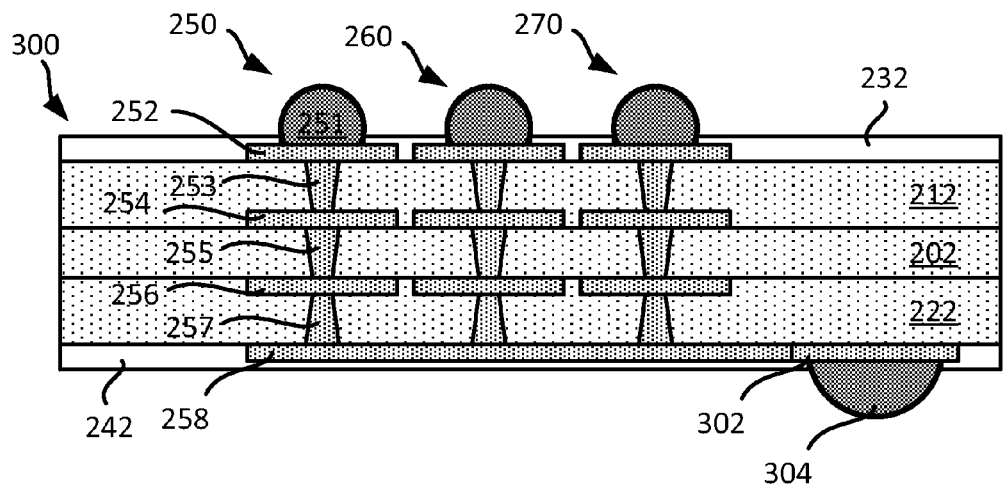
FIG. 3 illustrates a package substrate that includes several inductor structures.

FIG. 3 illustrates another example of a package substrate 300 that includes one or more inductors. The package substrate 300 is similar to the package substrate 200 of FIG. 2, except that the package substrate 300 illustrates an interconnect 302, and a solder ball 304. The interconnect 302 is coupled to the seventh interconnect 258. In some implementations, a ground signal (e.g., from a die) may traverse from the solder balls 251, 261, and/or 271 (through the various interconnects as described above in FIG. 2), to the seventh interconnect 258, the interconnect 302, and to the solder ball 304.

Figure 4:
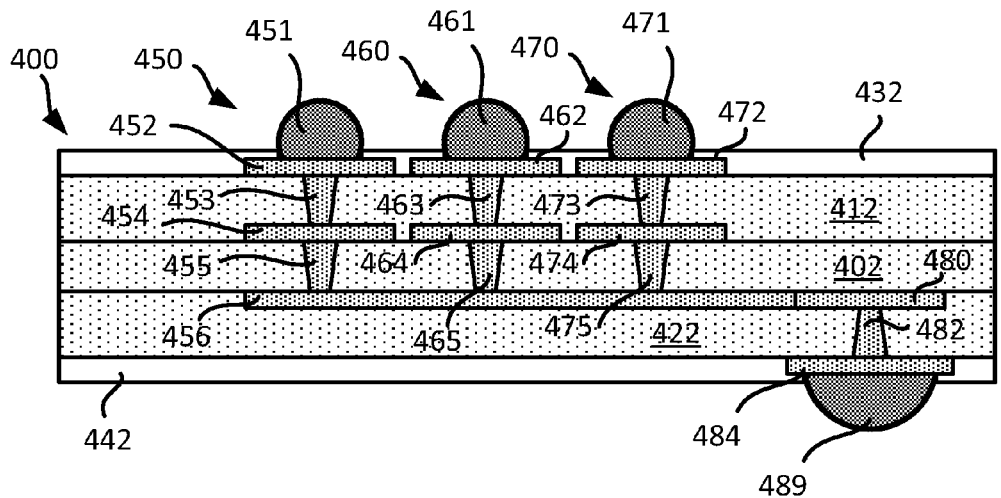
FIG. 4 illustrates a package substrate that includes several inductor structures.
Figure 5:
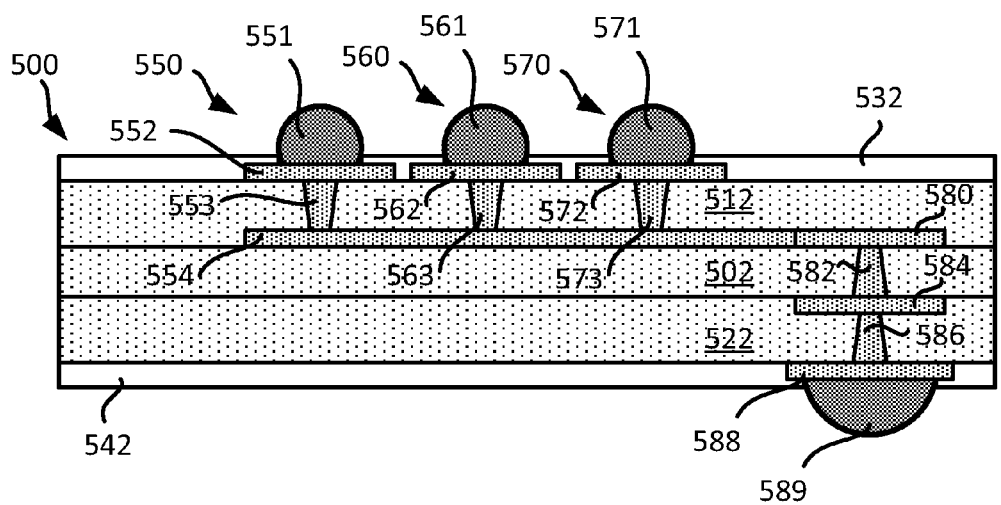
FIG. 5 illustrates a package substrate that includes several inductor structures.

It should be noted that different implementations may provide different configurations of inductors, inductor structures, and/or inductive means in a package substrate and/or printed circuit board. FIGS. 4-5 illustrate other exemplary implementations of such inductors, inductor structures, and/or inductive means in a package substrate and/or printed circuit board.

Exemplary High Quality Factor Inductor and/or High Quality Factor Filter in Package Substrate or Printed Circuit Board (PCB)

FIG. 4 illustrates a profile view of a packaging substrate 400 that includes one or more inductors. In some implementations, the packaging substrate 400 is an interposer. The packaging substrate 400 includes a first dielectric layer 402, a second dielectric layer 412, a third dielectric layer 422, a first solder resist layer 432, and a second solder resist layer 442.

The package substrate 400 may include a core layer or may be coreless. In some implementations, when the package substrate 400 includes a core layer, the first dielectric layer 402 is a core layer, and the second and third dielectric layers are prepeg layers. In some implementations, when the package substrate 400 is coreless, the first, second and third dielectric layers may be prepeg layers.

The package substrate 400 includes a first inductor structure 450, a second inductor structure 460, and a third inductor structure 470. In some implementations, the first, second and third inductor structures 450, 460, and 470 may collectively be an inductor structure. These inductor structures 450, 460, and/or 470, individually and/or collectively may be an inductive means.

As shown in FIG. 4, the first inductor structure 450 (which may be an inductive means) includes a solder ball 451, a first interconnect 452, a second interconnect 453, a third interconnect 454, a fourth interconnect 455, and a fifth interconnect 456. The first interconnect 452, the third interconnect 454, and the fifth interconnect 456 may be pads and/or traces in/on the package substrate 400. The second interconnect 453, and the fourth interconnect 455 may be vias in the package substrate 400.

Similarly, the second inductor structure 460 (which may be another inductive means) includes a solder ball 461, a first interconnect 462, a second interconnect 463, a third interconnect 464, a fourth interconnect 465, and the fifth interconnect 456. The first interconnect 462 and the third interconnect 464 may be pads and/or traces in/on the package substrate 400. The second interconnect 463 and the fourth interconnect 465 may be vias in the package substrate 400.

The third inductor structure 470 (which may be another inductive means) includes a solder ball 471, a first interconnect 472, a second interconnect 473, a third interconnect 474, a fourth interconnect 475, and the fifth interconnect 456. The first interconnect 472 and the third interconnect 474 may be pads and/or traces in/on the package substrate 400. The second interconnect 473 and the fourth interconnect 475 may be vias in the package substrate 400.

As shown in FIG. 4, the first, second, and third inductor structures 450, 460, and 470 share a common interconnect, namely the fifth interconnect 456. In the example of FIG. 4, the first, second, and third inductor structures 450, 460, and 470 are physically coupled together through the fifth interconnect 456. In some implementations, the fifth interconnect 456 is an interconnect means (e.g., interconnect) that is configured to provide an electrical path for a ground signal. For example, in some implementations, a ground signal (e.g., from a die) may traverse the first inductor structure 450 through the solder ball 451, the first interconnect 452, the second interconnect 453, the third interconnect 454, the fourth interconnect 455, to the fifth interconnect 456. The same ground signal may traverse the second and third inductor structures 460 and 470 to the fifth interconnect 456. The fifth interconnect 456 may be a single interconnect, a plate and/or combination of traces and/or pads.

In some implementations, the configuration of the first, second, and/or third inductor structures 450, 460, and/or 470 provides one or more inductor or inductor structure with a high quality factor (Q). In some implementations, the quality factor (Q) of the first, second and/or third inductor structures 450, 460 and/or 470 may be about 20 or greater (either collectively or individually). In some implementations, the quality factor (Q) of the first, second and/or third inductor structures 450, 460 and/or 470 may be about 200 or greater (either collectively or individually)

The package substrate 400 also illustrates an interconnect 480, a second interconnect 482, a third interconnect 484, and a solder ball 489. The first and third interconnects 480 and 484 may be traces and/or pads. The second interconnect 482 may be vias. The first interconnect 480 is coupled to the fifth interconnect 456. In some implementations, a ground signal (e.g., from a die) may traverse from the solder balls 451, 461, and/or 471 (through the various interconnects as described above), to the fifth interconnect 456, the first interconnect 480, the second interconnect 482, the third interconnect 484 and to the solder ball 489.

It should be noted that instead of a package substrate, the high quality factor inductor may be integrated in a printed circuit board (PCB) in a similar manner described above.

In addition, the above inductor structures 450, 460 and/or 470 may be implemented or configured with a capacitor to operate as a filter for an electrical signal. In some implementations, the filter is one of at least a trap filter, a notch filter and/or a $3^{rd}$ harmonic suppression filter. In some implementations, the filter is a high quality factor (Q) filter. Examples a capacitor and a filter will be further described below in FIGS. 7 and 9-12. Also, in some implementations, the above inductor structures 450, 460, and/or 470 may be implemented with an inductor in an integrated device (e.g., die).

Exemplary High Quality Factor Inductor and/or High Quality Factor Filter in Package Substrate or Printed Circuit Board (PCB)

FIG. 5 illustrates a profile view of a packaging substrate 500 that includes one or more inductors. In some implementations, the packaging substrate 500 is an interposer. The packaging substrate 500 includes a first dielectric layer 502, a second dielectric layer 512, a third dielectric layer 522, a first solder resist layer 532, and a second solder resist layer 542.

The package substrate 500 may include a core layer or may be coreless. In some implementations, when the package substrate 500 includes a core layer, the first dielectric layer 502 is a core layer, and the second and third dielectric layers are prepeg layers. In some implementations, when the package substrate 500 is coreless, the first, second and third dielectric layers may be prepeg layers.

The package substrate 500 includes a first inductor structure 550, a second inductor structure 560, and a third inductor structure 570. In some implementations, the first, second and third inductor structures 550, 560, and 570 may collectively be an inductor structure. These inductor structures 550, 560, and/or 570, individually and/or collectively may be an inductive means.

As shown in FIG. 5, the first inductor structure 550 (which may be an inductive means) includes a solder ball 551, a first interconnect 552, a second interconnect 553, and a third interconnect 554. The first interconnect 552 and the third interconnect 554 may be pads and/or traces in/on the package substrate 500. The second interconnect 553 may be vias in the package substrate 500.

Similarly, the second inductor structure 560 (which may be another inductive means) includes a solder ball 561, a first interconnect 562, a second interconnect 563, and a third interconnect 564. The first interconnect 562 and the third interconnect 564 may be pads and/or traces in/on the package substrate 500. The second interconnect 563 may be vias in the package substrate 500.

The third inductor structure 570 (which may be another inductive means) includes a solder ball 571, a first interconnect 572, a second interconnect 573, and a third interconnect 574. The first interconnect 572 and the third interconnect 574 may be pads and/or traces in/on the package substrate 500. The second interconnect 573 may be vias in the package substrate 500.

As shown in FIG. 5, the first, second, and third inductor structures 550, 560, and 570 share a common interconnect, namely the fifth interconnect 556. In the example of FIG. 5, the first, second, and third inductor structures 550, 560, and 570 are physically coupled together through the third interconnect 554. In some implementations, the third interconnect 554 is an interconnect means (e.g., interconnect) that is configured to provide an electrical path for a ground signal. For example, in some implementations, a ground signal (e.g., from a die) may traverse the first inductor structure 550 through the solder ball 551, the first interconnect 552, the second interconnect 553, and the third interconnect 554. The same ground signal may traverse the second and third inductor structures 560 and 570 to the third interconnect 554. The third interconnect 554 may be a single interconnect, a plate and/or combination of traces and/or pads.

In some implementations, the configuration of the first, second, and/or third inductor structures 550, 560, and/or 570 provides one or more inductor or inductor structure with a high quality factor (Q). In some implementations, the quality factor (Q) of the first, second and/or third inductor structures 550, 560 and/or 570 may be about 20 or greater (either collectively or individually). In some implementations, the quality factor (Q) of the first, second and/or third inductor structures 550, 560 and/or 570 may be about 200 or greater (either collectively or individually).

The package substrate 500 also illustrates a first interconnect 580, a second interconnect 582, a third interconnect 584, a fourth interconnect 586, a fifth interconnect 588, and a solder ball 589. The first, third and fifth interconnects 580, 584, and 588 may be traces and/or pads. The second and fourth interconnects 582 and 586 may be vias. The first interconnect 580 is coupled to the third interconnect 554. In some implementations, a ground signal (e.g., from a die) may traverse from the solder balls 551, 561, and/or 571 (through the various interconnects as described above), to the third interconnect 554, the first interconnect 580, the second interconnect 582, the third interconnect 584, the fourth interconnect 586, the fifth interconnect 588 and to the solder ball 589.

It should be noted that instead of a package substrate, the high quality factor inductor may be integrated in a printed circuit board (PCB) in a similar manner described above.

In addition, the above inductor structures 550, 560 and/or 570 may be implemented or configured with a capacitor to operate as a filter for an electrical signal. In some implementations, the filter is one of at least a trap filter, a notch filter and/or a $3^{rd}$ harmonic suppression filter. In some implementations, the filter is a high quality factor (Q) filter. Examples a capacitor and a filter will be further described below in FIGS. 7 and 9-12. Also, in some implementations, the above inductor structures 550, 560, and/or 570 may be implemented with an inductor in an integrated device (e.g., die).

Exemplary Array of High Quality Factor Inductors

As mentioned above, one or more inductor structures may be arranged and/or configured together to collectively produce an inductor structure or inductive means with a high quality factor.

Figure 6:
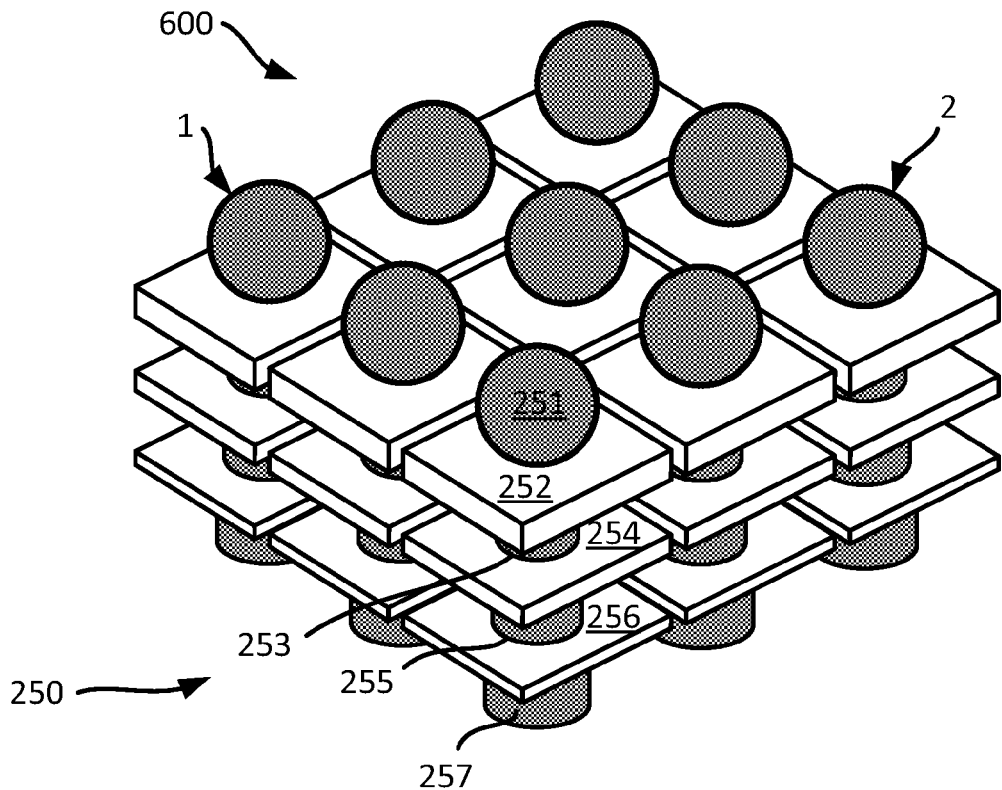
FIG. 6 illustrates an angled view of an inductor structure array.

FIG. 6 illustrates an inductor structure array 600 that includes several inductor structures or inductive means. The inductor structure array 600 may be referred to as an inductor structure or inductive means, in some implementations. As shown in FIG. 6, the inductor structure array 600 includes nine (9) inductor structures (e.g., inductor structure 250), arranged in a symmetric 3×3 configuration. However, it should be noted that different implementations may use different configurations and/or numbers of inductor structures. In some implementations, these configurations may be symmetrical (2×2 array) or asymmetrical (e.g., 2×3 array). In addition, the spacing between the inductor structures may be the same or different in the inductor structure array. Thus, the inductor structure array 600 is merely an example of how inductor structures may be configured and/or arranged in a package substrate or printed circuit board (PCB). It should be noted that for the purpose of clarity, FIG. 6 does not illustrate an interconnect (e.g., interconnect 258 of FIG. 2) that physically couples the inductor structures together. In some implementations, such an interconnect (e.g., ground interconnect) may be one contiguous pad that physically couples each inductor structures, or such an interconnect may be several traces and/or pads that physically couples each inductor structures.

It should be noted that different implementations may provide different configurations of inductors, inductor structures, and/or inductive means in a package substrate and/or printed circuit board. FIGS. 2-6 merely provide examples of how an inductor structure or inductor structure array may be configured. In some implementations, one or more of the inductor structure may have more or less number of interconnects and/or vias. In some implementations, at least one inductor structure has at least one interconnects (e.g., pad) and at least one via, and is coupled to another inductor structure through an interconnect (e.g., interconnect 258) that is configured to provide an electrical path for a ground signal.

Exemplary Circuit Diagram that Includes a High Quality Factor Inductor

Figure 7:
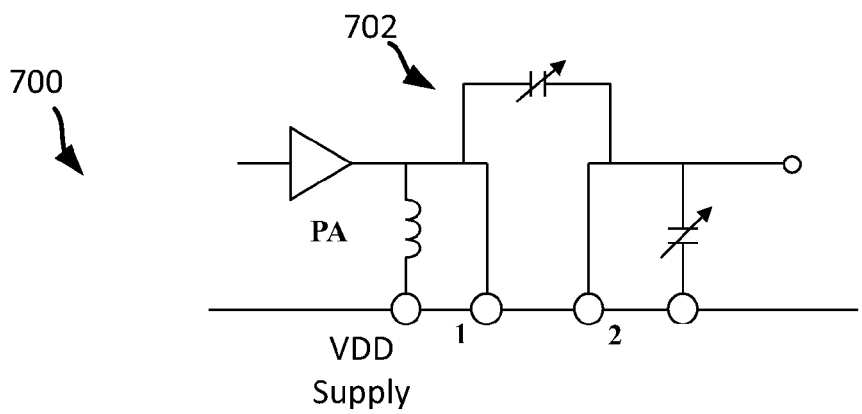
FIG. 7 illustrates an exemplary circuit diagram for an integrated device that includes a package substrate that includes several inductor structures.

FIG. 7 illustrates a circuit diagram 700 of an integrated device that includes a die, and that is coupled to a package substrate or a printed circuit board (PCB). The circuit diagram 700 includes a capacitor circuit element 702. The capacitor circuit element 702 may correspond to a capacitor in an integrated device (e.g., die). Examples of capacitors in an integrated device will further be described in FIGS. 10-12.

The circuit diagram 700 also includes two points (1) and (2). In some implementations, these two points (1) and (2) correspond to terminals 1 and terminals 2 as shown in FIG. 6. That is, in some implementations, these two points (1) and (2) correspond to terminals that are coupled to respective solder balls in the inductor structure array 600 of FIG. 6. In some implementations, these two points (1) and (2) may correspond to respective solder balls in the inductor structure array 600 of FIG. 6.

In some implementations, the combination of the capacitor circuit element 702 and the inductor structure array between the two points (1) and (2) is configured to operate as a filter in the integrated device. In some implementations, the filter is a capacitor circuit element 702 and the inductor structure array may be coupled together to implement a parallel LC resonator filter that is connected in series to the RF signal path. This filter may be tuned to the $3^{rd}$ harmonic frequency of the integrated device in order to suppress the $3^{rd}$ harmonic component of the signal and not degrading the fundamental component of the signal.

Exemplary Characteristics of a High Quality Factor Inductor

Figure 8:
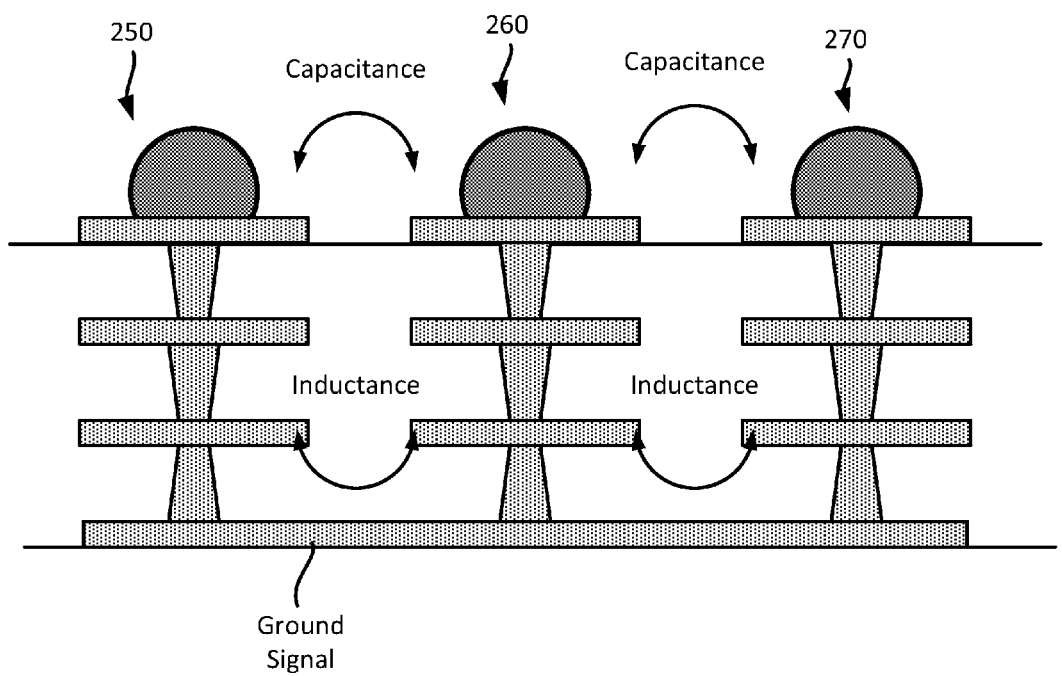
FIG. 8 illustrates a package substrate that includes several inductor structures.

FIG. 8 illustrates how the configuration of several inductor structures may provide for a high quality factor inductor structures. Specifically, FIG. 8 illustrates the first, second, and third inductor structures 250, 260, and 270 in a package substrate or printed circuit board (PCB).

As shown in FIG. 8, portions of the first inductor structure 250 and the second inductor structure 260 in the package substrate or PCB provide an enhanced inductance characteristic (e.g., increase inductance). Similarly, portions of the second inductor structure 260 and the third inductor structure 270 in the package substrate or PCB provide an enhanced inductance characteristic (e.g., increase inductance).

In some implementations, the first, second, and third inductor structure 250, 260, and 270 have a certain amount of inductance from the solder balls (e.g., 251, 261, 271) to the interconnect 258 through the first interconnect 252, the first via 253, the second interconnect 254, the second via 255, the third interconnect 562, and the third via 257. In addition, there may be capacitive coupling represented as capacitance in FIG. 8 between interconnect 252 and interconnect 262, interconnect 254 and interconnect 264, interconnect 256 and interconnect 266, and between interconnect 262 and interconnect 272, interconnect 264 and interconnect 274, interconnect 266 and interconnect 276. The combination of the inductance and capacitance between inductance structures enhances the inductance characteristic between terminals.

Exemplary Integrated Device that Includes of High Quality Factor Inductors

Figure 9:
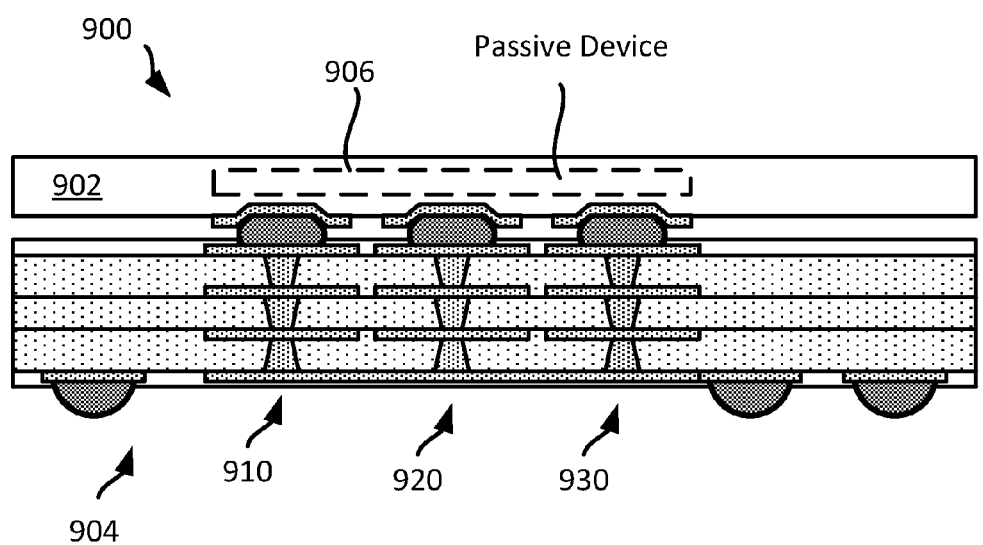
FIG. 9 illustrates an exemplary integrated device that includes a die and a package substrate comprising a passive device.

FIG. 9 illustrates an integrated device 900 that includes a die 902 and a package substrate 904. The die 902 includes a passive device 906. A passive device may include a capacitor (e.g., Metal Insulator Metal (MIM) capacitor) and/or an inductor (e.g., spiral inductor). The package substrate 904 includes a first inductor structure 910, a second inductor structure 920, and a third inductor structure 930.

The die 902 is coupled to the package substrate 904. The package substrate 904 includes several inductor structures. In some implementations, the package substrate 904 may be any of the package substrates described in the present disclosure. As shown in FIG. 9, in some implementations, the passive device 906 vertically (e.g., at least partially) overlaps with one or more of the inductor structures on the package substrate 904.

In some implementations, the combination of the passive device 906 (e.g., capacitor in die 902) and one or more of the inductor structures 910, 920, and/or 930 is configured to operate as a filter in the integrated device 900. In some implementations, the filter is a suppression filter (e.g., $3^{rd}$ harmonic suppression filter).

Having described a passive device in a die, several examples of a passive device in a die will now be described in detail.

Exemplary Integrated Device Comprising a Passive Device

Figure 10:
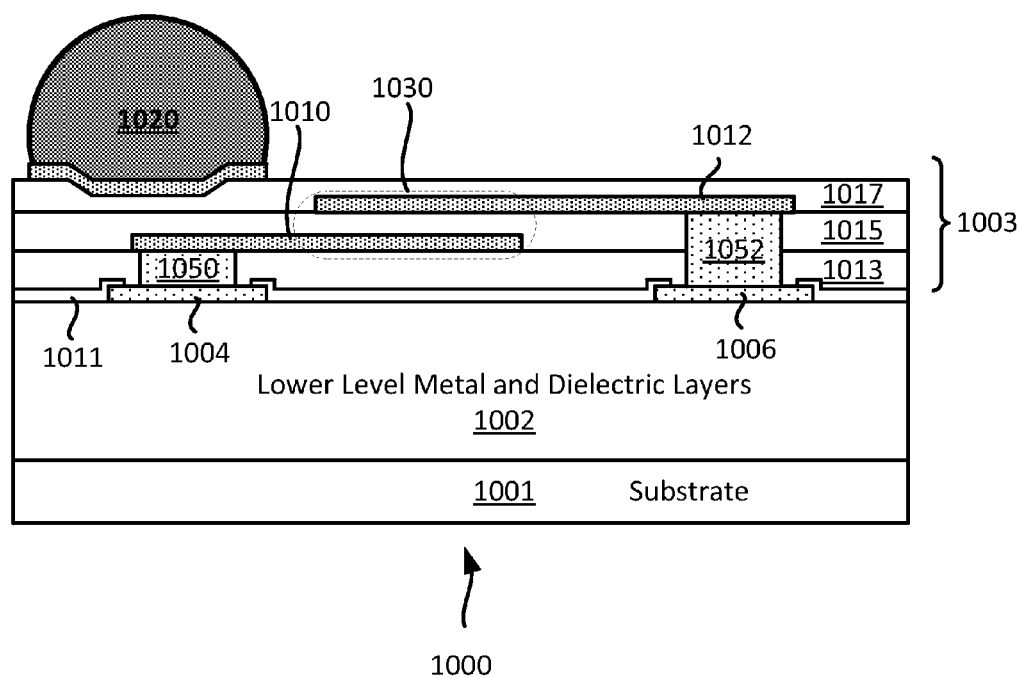
FIG. 10 illustrates an exemplary integrated device that includes a passive device in a redistribution portion.

FIG. 10 illustrates a profile view of an integrated device 1000 that includes a passive device in a redistribution portion of the integrated device. In some implementations, the integrated device 1000 is one of at least a die, and/or a wafer level package integrated device. In some implementations, the passive device is one of at least a capacitor and/or an inductor. In some implementations, the capacitor may be one of at least a metal-insulator-metal (MIM) capacitor and/or a metal-oxide-metal (MOM) capacitor. In some implementations, the inductor may be a spiral inductor.

The integrated device 1000 includes a substrate 1001, lower level metal and dielectric layers 1002, and a redistribution portion 1003. In some implementations, the substrate 1001 is a silicon substrate and/or wafer (e.g., silicon wafer). The lower level metal and dielectric layers 1002 include lower level metal layers (e.g., M1 metal layer, M2 metal layer, M3 metal layer, M4 metal layer, M5 metal layer, M6 metal layer, M7 metal layer). The lower metal layers of the lower level metal and dielectric layers 1002 include traces and/or vias. The lower level metal and dielectric layers 1002 also include one or more dielectric layers. In some implementations, the lower level metal and dielectric layers 1002 are provided and/or formed using a back end of line (BEOL) process.

The integrated device 1000 also includes a first pad 1004, a second pad 1006, and a passivation layer 1011. In some implementations, the first pad 1004, and the second pad 1006 are referred to as the top metal layer of the integrated device 1000. The first and second pads 1004 and 1006 are coupled to respective lower metals in the lower metal and dielectric layers 1002.

The redistribution portion 1003 includes a first via 1050, a second via 1052, a first dielectric layer 1013, a second dielectric layer 1015, a third dielectric layer 1017, a first redistribution interconnect 1010, a second redistribution interconnect 1012, and an under bump metallization (UBM) layer 1014. The first redistribution interconnect 1010 is electrically coupled to the first via 1050. The first via 1050 is electrically coupled to the first pad 1004. The second redistribution interconnect 1012 is electrically coupled to the second via 1052. The second via 1052 is electrically coupled to the second pad 1006. The second via 1052 traverses the first and second dielectric layers 1013 and 1015. The first and second interconnects 1010 and 1012 have a relatively flat shape.

As shown in FIG. 10, a portion of the first redistribution interconnect 1010 overlaps (e.g., vertically overlaps) with a portion of the second redistribution interconnect 1012. In some implementations, the overlapping (e.g., vertically overlapping) portions of the first and second redistribution interconnects 1010 and/or 1012 are configured to form and/or define a passive device 1030 in the redistribution portion 1003. That is, the passive device 1030 may be defined by either or both the redistribution interconnects 1010 and/or 1012. The passive device 1030 may include one of at least a capacitor and/or an inductor. For example, the redistribution interconnects 1010 or 1012 may be configured as an inductor. In another example, the combination of the redistribution interconnects 1010 and 1012 may be configured as a capacitor.

The first, second and third dielectric layers 1013, 1015 and 1017 are insulation layers. In some implementations, the first, second and third dielectric layers 1013, 1015 and 1017 may be polyimide layers. For example, the first, second and third dielectric layers 1013, 1015 and 1017 may be Polybenzoxazole (PbO) layers and/or polymer layers.

FIG. 10 further illustrates a solder ball 1020 coupled to the UBM layer 1014. However, in some implementations, the solder ball 1020 may be directly coupled to a redistribution interconnect. For example, the solder ball 1020 may be directly coupled to the second redistribution interconnect 1012.

Exemplary Integrated Device Comprising a Passive Device

Figure 11:
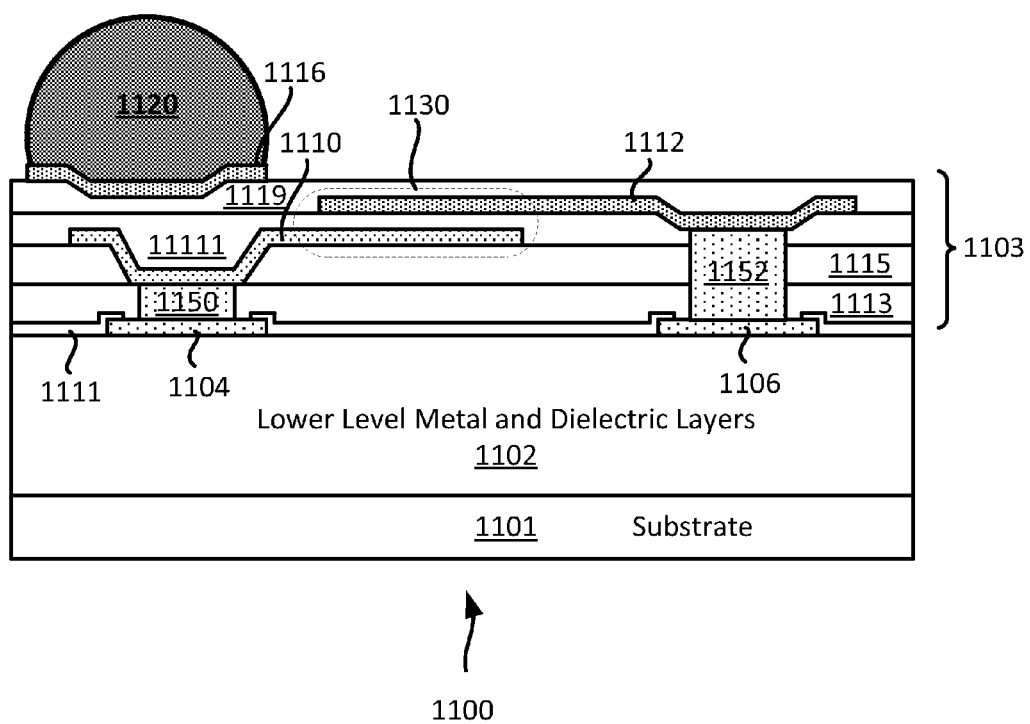
FIG. 11 illustrates another exemplary integrated device that includes a passive device in a redistribution portion.

FIG. 11 illustrates a profile view of an integrated device 1100 that includes a passive device in a redistribution portion of the integrated device. In some implementations, the integrated device 1100 is one of at least a die, and/or a wafer level package integrated device. In some implementations, the passive device is one of at least a capacitor and/or an inductor. In some implementations, the capacitor may be one of at least a metal-insulator-metal (MIM) capacitor and/or a metal-oxide-metal (MOM) capacitor. In some implementations, the inductor may be a spiral inductor.

The integrated device 1100 includes a substrate 1101, lower level metal and dielectric layers 1102, and a redistribution portion 1103. In some implementations, the substrate 1101 is a silicon substrate and/or wafer (e.g., silicon wafer). The lower level metal and dielectric layers 1102 include lower level metal layers (e.g., M1 metal layer, M2 metal layer, M3 metal layer, M4 metal layer, M5 metal layer, M6 metal layer, M7 metal layer). The lower metal layers of the lower level metal and dielectric layers 1102 include traces and/or vias. The lower level metal and dielectric layers 1102 also include one or more dielectric layers. In some implementations, the lower level metal and dielectric layers 1102 are provided and/or formed using a back end of line (BEOL) process.

The integrated device 1100 also includes a first pad 1104, a second pad 1106, and a passivation layer 1111. In some implementations, the first pad 1104, and the second pad 1106 are referred to as the top metal layer of the integrated device. The first and second pads 1104 and 1106 are coupled to respective lower metals in the lower metal and dielectric layers 1102.

The redistribution portion 1103 includes a first via 1150, a second via 1152, a first dielectric layer 1113, a second dielectric layer 1115, a third dielectric layer 1117, a fourth dielectric layer 1119, a first redistribution interconnect 1110, a second redistribution interconnect 1112, and an under bump metallization (UBM) layer 1114. The first redistribution interconnect 1110 is electrically coupled to the first via 1150. The first via 1150 is electrically coupled to the first pad 1104. The second redistribution interconnect 1112 is electrically coupled to the second via 1152. The second via 1152 is electrically coupled to the second pad 1106. The second via 1152 has a greater height than the first via 1150. The second via 1152 traverses the first and second dielectric layers 1113 and 1115. The first and second interconnects 1110 and 1112 have a shape that is at least partially U or V shaped.

As shown in FIG. 11, a portion of the first redistribution interconnect 1110 overlaps (e.g., vertically overlaps) with a portion of the second redistribution interconnect 1112. In some implementations, the overlapping (e.g., vertically overlapping) portions of the first and second redistribution interconnects 1110 and/or 1112 are configured to form and/or define a passive device 1130 in the redistribution portion 1103. That is, the passive device 1130 may be defined by either or both the redistribution interconnects 1110 and/or 1112. The passive device 1130 may include one of at least a capacitor and/or an inductor. For example, the redistribution interconnects 1110 or 1112 may be configured as an inductor. In another example, the combination of the redistribution interconnects 1110 and 1112 may be configured as a capacitor.

The first, second, third and fourth dielectric layers 1113, 1115, 1117 and 1119 are insulation layers. In some implementations, the first, second, third and fourth dielectric layers 1113, 1115, 1117 and 1119 may be polyimide layers. For example, the first, second and third dielectric layers 1113, 1115 and 1117 may be Polybenzoxazole (PbO) layers and/or polymer layers.

FIG. 11 further illustrates a solder ball 1120 coupled to the UBM layer 1114. However, in some implementations, the solder ball 1120 may be directly coupled to a redistribution interconnect. For example, the solder ball 1120 may be directly coupled to the second redistribution interconnect 1112.

Exemplary Integrated Devices Comprising a Passive Device

Figure 12:
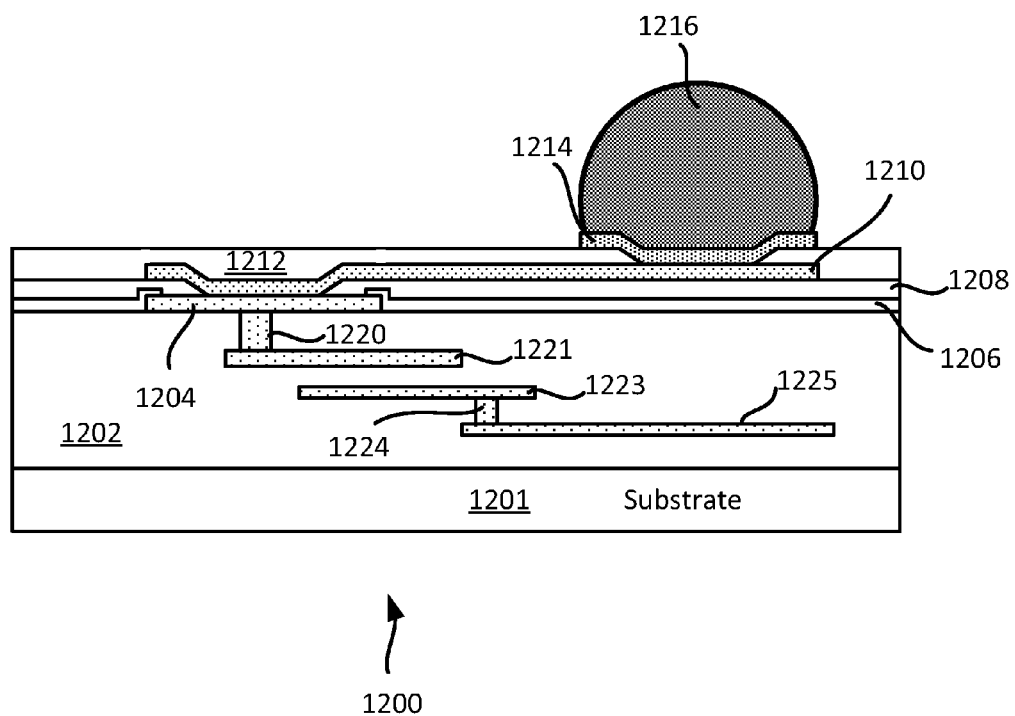
FIG. 12 illustrates another exemplary integrated device that includes a passive device.

FIG. 12 illustrates an example of a profile view of an integrated device 1200 that includes a passive device. The integrated device 1200 includes a substrate 1201, several lower level metal and dielectric layers 1202, a pad 1204, a passivation layer 1206, a first insulation layer 1208, a first metal redistribution layer 1210, a second insulation layer 1212, and an under bump metallization (UBM) layer 1214. The integrated device 1200 also includes a solder ball 1216. Specifically, the solder ball 1216 of the integrated device 1200 is configured to couple to interconnects of a package substrate or a printed circuit board (PCB) (both not shown).

The lower level metal and dielectric layers 1202 includes a passive device (e.g., capacitor or inductor). In the example of FIG. 12, the passive device is a capacitor. In some implementations, a capacitor is a passive capacitive means configured to store energy (e.g., store energy electrostatically in an electric field). In some implementations, the capacitor is one of at least a metal-insulator-metal (MIM) capacitor and/or a metal-oxide-metal (MOM) capacitor. The capacitor includes a first interconnect 1220, a second interconnect 1221, a third interconnect 1223, a fourth interconnect 1224, and a fifth interconnect 1225. In some implementations, the first interconnect 1220 is a first via. In some implementations, the second interconnect 1221 is a first trace. In some implementations, the third interconnect 1223 is a second trace. In some implementations, the fourth interconnect 1224 is a second via. In some implementations, the fifth interconnect 1225 is a third trace. In some implementations, the first interconnect 1220, the second interconnect 1221, the third interconnect 1223, the fourth interconnect 1224, and/or the fifth interconnect 1225 are lower level metal layers in the integrated device 1200 (e.g., die).

Figure 13A:
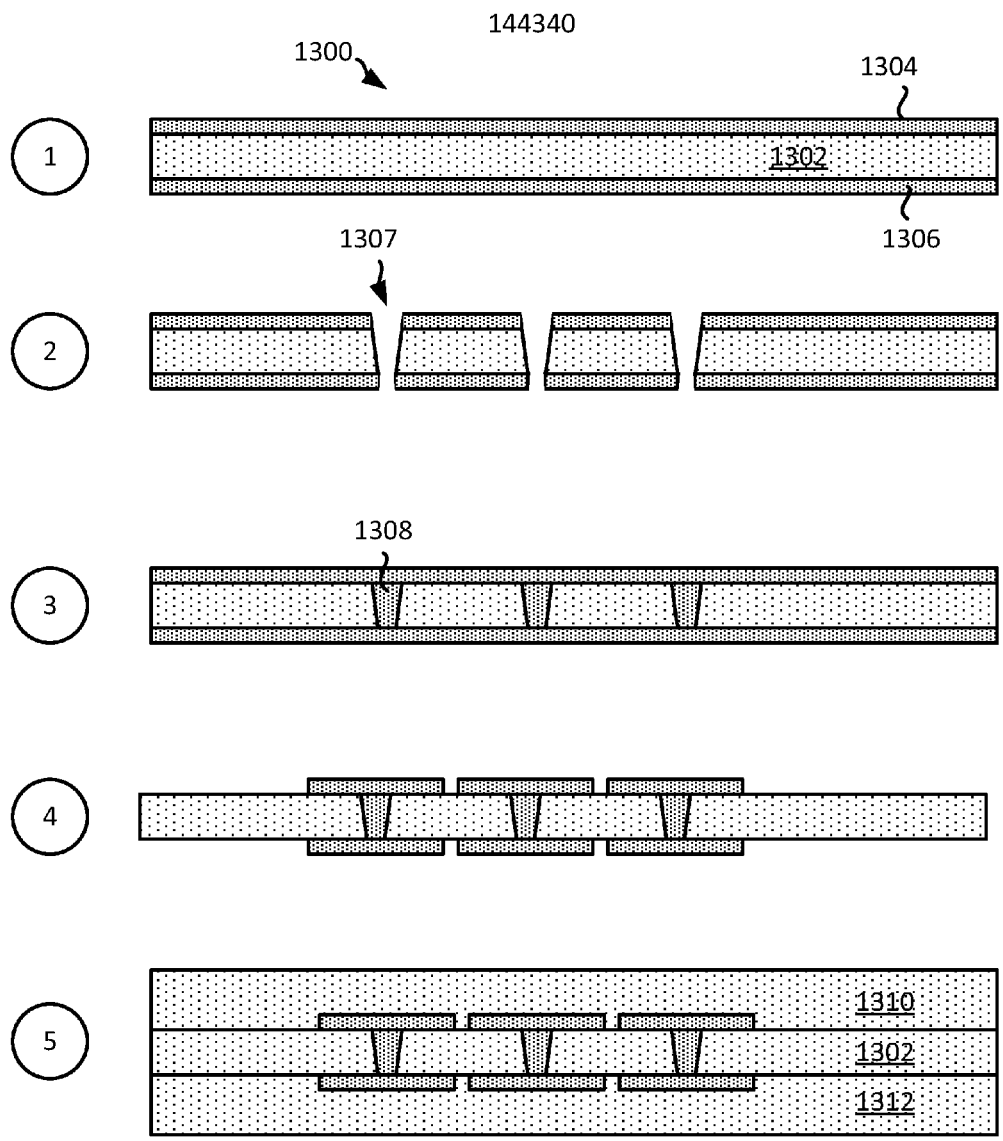
FIG. 13 (comprising 13A-13C) illustrates an exemplary sequence for providing/fabricating a package substrate that includes an inductor structure.
Figure 13B:
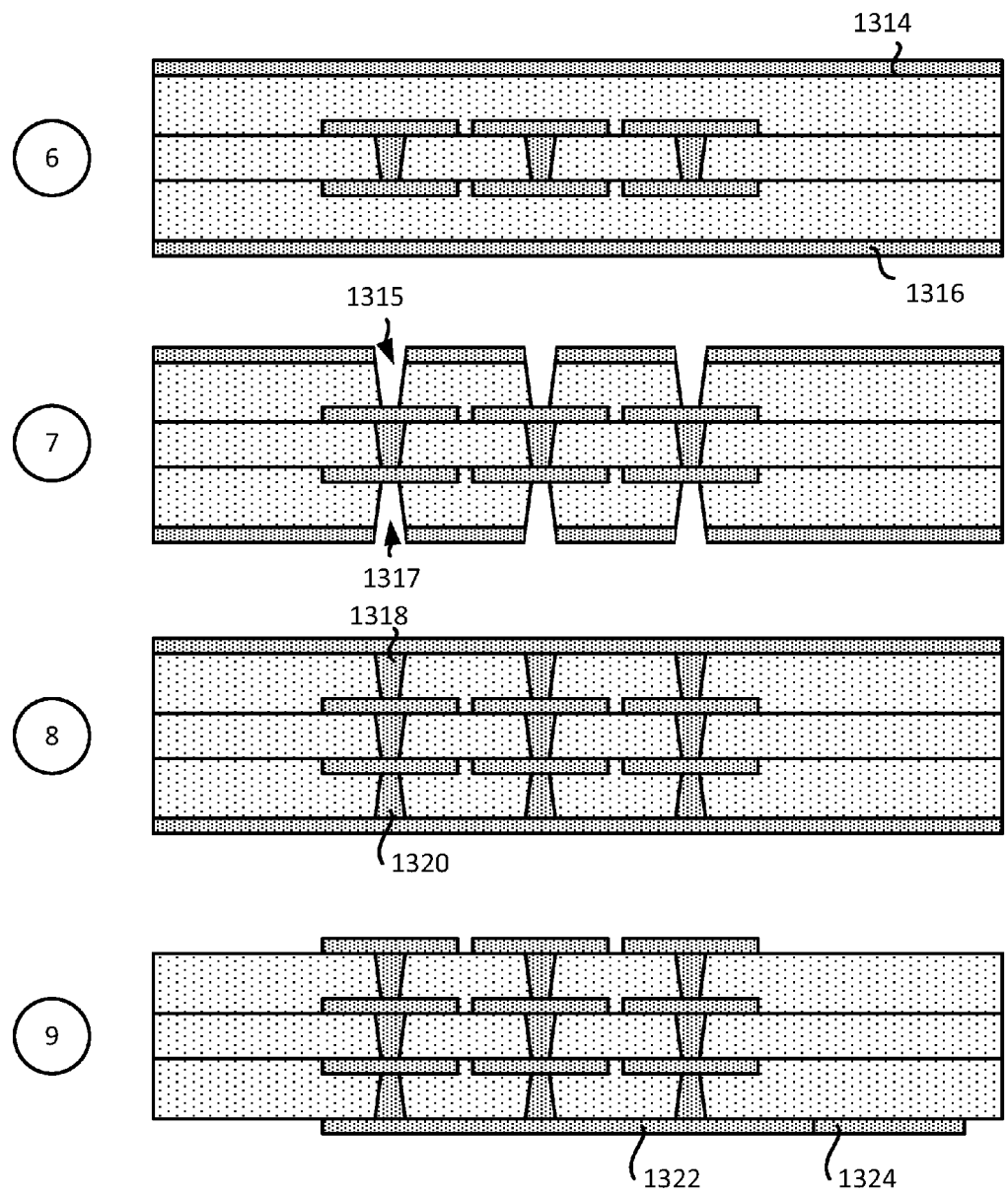
Figure 13C:
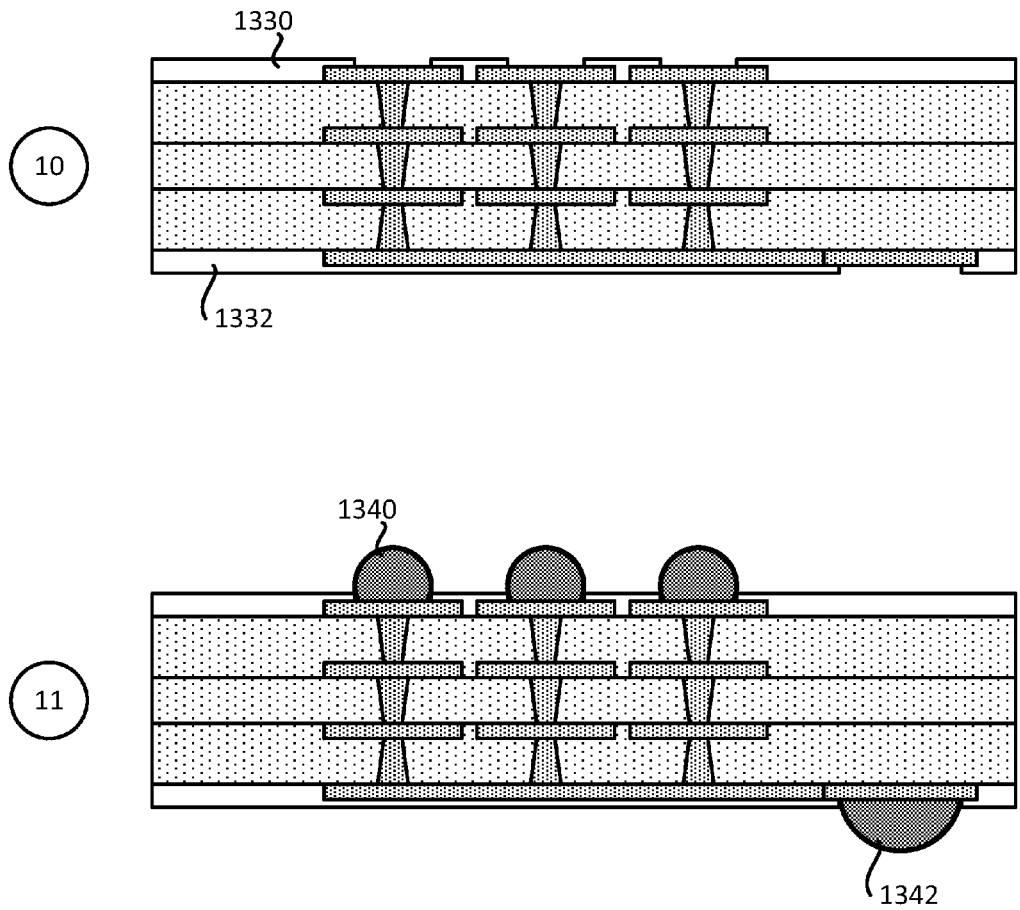

Exemplary Sequence for Providing/Fabricating a Package Substrate that Includes a High Quality Factor Inductor In some implementations, providing/fabricating a package substrate with one or more high quality factor inductors includes several processes. FIG. 13 (which includes FIGS. 13A-13C) illustrates an exemplary sequence for providing/fabricating a package substrate with one or more high quality factor inductors. In some implementations, the sequence of FIGS. 13A-13C may be used to provide/fabricate the package substrate of FIG. 3 and/or other package substrate in the present disclosure. In some implementations, FIGS. 13A-13C may be used to provide/fabricate a printed circuit board (PCB) that includes one or more high quality factor inductors. However, for the purpose of simplification, FIGS. 13A-13C will be described in the context of providing/fabricating the package substrate of FIG. 3.

It should be noted that the sequence of FIGS. 13A-13C may combine one or more stages in order to simplify and/or clarify the sequence for providing a package substrate. In some implementations, the order of the processes may be changed or modified. In some implementations, a sequence similar to the sequence of FIGS. 13A-13C may be used to provide a printed circuit board (PCB).

Stage 1 of FIG. 13A, illustrates a state after a core layer 1300 is provided. In some implementations, the core layer 1300 is provided by a supplier. In some implementations, the core layer 1300 is fabricated (e.g., formed). The core layer 1300 includes a first dielectric layer 1302, a first metal layer 1304, and a second metal layer 1306. The first metal layer 1304 is on a first surface (e.g., top surface) of the first dielectric layer 1302. The second metal layer 1306 is on a second surface (e.g. bottom surface) of the first dielectric layer 1302.

Stage 2 illustrates a state after several cavities are formed in the core layer 1300. As shown at stage 2, several cavities (e.g., cavity 1307) are formed in the first dielectric layer 1302, the first metal layer 1304, and the second metal layer 1306. Different implementations may use different processes for forming the cavities in the core layer 1300. In some implementations, a laser process and/or a photo etching process may be used to form the cavities in the core layer 1300.

Stage 3 illustrates a state after vias (e.g., via 1308) are formed in the cavities (e.g., cavity 1307). Different implementations may use different processes for forming the vias in the cavities. In some implementations, one or more plating process may be used to form the vias. In some implementations, a paste may be use to form the vias.

Stage 4 illustrates a state after portions of the first metal layer 1304 and portions of the second metal layer 1306 are selectively removed (e.g., etching) to define one or more interconnects (e.g., traces, pads).

Stage 5 illustrates a state after a second dielectric layer 1310 and a third dielectric layer 1312 are formed on the core layer 1300. As shown at stage 4, the second dielectric layer 1310 is formed over the first surface of the first dielectric layer 1302, and the third dielectric layer 1312 is formed over the second surface of the first dielectric layer 1302. In some implementations, the second and third dielectric layers 1310 and 1312 are prepeg layers.

Stage 6, as shown in FIG. 13B, illustrates a state after a third metal layer 1314 and a fourth metal layer 1316 are formed. Specifically, the third metal layer 1314 is formed over the second dielectric layer 1310, and the fourth metal layer 1316 is formed over the third dielectric layer 1312.

Stage 7 illustrates a state after several cavities are formed in the second and third dielectric layers 1310 and 1312. As shown at stage 2, several cavities (e.g., cavity 1315) are formed in the second dielectric layer 1310 and the third metal layer 1314. Several cavities (e.g., cavity 1317) are also formed in the third dielectric layer 1312 and the fourth metal layer 1316. Different implementations may use different processes for forming the cavities. In some implementations, a laser process and/or a photo etching process may be used to form the cavities.

Stage 8 illustrates a state after vias (e.g., vias 1318, 1320) are formed in the cavities (e.g., cavities 1315, 1317). Different implementations may use different processes for forming the vias in the cavities. In some implementations, one or more plating process may be used to form the vias. In some implementations, a paste may be use to form the vias.

Stage 9 illustrates a state after portions of the third metal layer 1314 and portions of the fourth metal layer 1316 are selectively removed (e.g., etched) to define one or more interconnects (e.g., traces, pads). For example, selectively removing the fourth metal layer 1316 may define a ground signal interconnect 1322 and a pad 1324.

Stage 10, as shown in FIG. 13C, illustrates a state after a first solder resist layer 1330 and a second solder resist layer 1332 are formed on portions of the package substrate.

Stage 11 illustrates a state after a first set of solder balls 1340 are provided on the package substrate. Stage 11 also illustrates a state after a second set of solder balls 1342 are provided on the package substrate.

Figure 14:
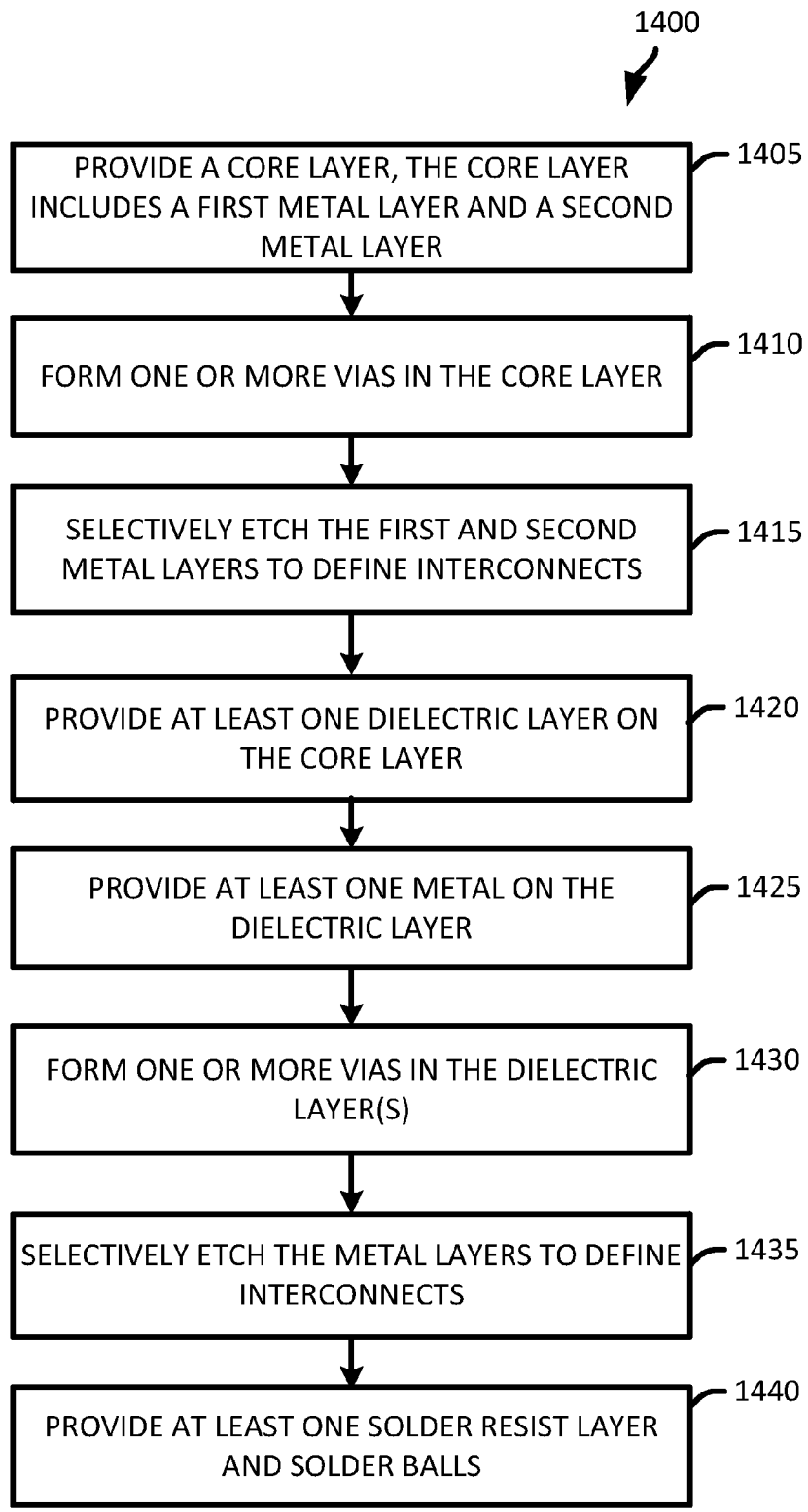
FIG. 14 illustrates an exemplary flow diagram of a method for providing/fabricating a package substrate that includes an inductor structure.

Exemplary Flow Diagram of a Method for Providing/Fabricating a Package Substrate that Includes a High Quality Factor Inductor In some implementations, providing/fabricating a package substrate with one or more high quality factor inductors includes several processes. FIG. 14 illustrates an exemplary flow diagram of a method for providing/fabricating a package substrate with one or more high quality factor inductors. In some implementations, the method of FIG. 14 to provide/fabricate the package substrate of FIG. 3 and/or other package substrates in the present disclosure. In some implementations, FIG. 14 may be used to provide/fabricate a printed circuit board (PCB) that includes one or more high quality factor inductors.

It should be noted that the method of FIG. 14 may combine one or more steps in order to simplify and/or clarify the sequence for providing an integrated device. In some implementations, the order of the processes may be changed or modified.

The method provides (at 1405) a core layer. In some implementations, the core layer is provided by a supplier. In some implementations, the core layer is fabricated (e.g., formed). The core layer may include a first dielectric layer, a first metal layer, and a second metal layer. The first metal layer is on a first surface (e.g., top surface) of the first dielectric layer. The second metal layer is on a second surface (e.g. bottom surface) of the first dielectric layer.

The method provides (at 1410) several vias in the core layer. In some implementations, providing (e.g., forming) several vias includes forming several cavities in the core layer and forming metal layers in the cavities to define one or more vias. Different implementations may use different processes for forming the cavities in the core layer. In some implementations, a laser process and/or a photo etching process may be used to form the cavities in the core layer. Different implementations may use different processes for forming the vias in the cavities. In some implementations, one or more plating process may be used to form the vias. In some implementations, a paste may be use to form the vias.

The method selectively removes (at 1415) portions of the first and second metal layers to define interconnects (e.g., pads, traces). In some implementations, selectively removing portions of the first and second metal layers includes etching (e.g., photo etching) the first and second metal layers.

The method then provides (at 1420) at least one dielectric layer on the core layer. In some implementations, providing at least one dielectric layer includes forming at least one dielectric layer on the core layer.

The method provides (at 1425) at least one metal layer (e.g., third and fourth metal layers) on the dielectric layer. In some implementations, providing at least one metal layer includes forming a metal layer on the dielectric layer.

The method provides (at 1430) several vias in the dielectric layer(s). In some implementations, providing (e.g., forming) several vias includes forming several cavities in the dielectric layer(s) and forming metal layers in the cavities to define one or more vias. Different implementations may use different processes for forming the cavities in the dielectric layer(s). In some implementations, a laser process and/or a photo etching process may be used to form the cavities in the dielectric layer(s). Different implementations may use different processes for forming the vias in the cavities. In some implementations, one or more plating process may be used to form the vias. In some implementations, a paste may be used to form the vias.

The method selectively removes (at 1435) portions of the metal layer(s) (e.g., third and fourth metal layers) to define interconnects (e.g., pads, traces). In some implementations, selectively removing portions of the metal layer(s) includes etching (e.g., photo etching) the first and second metal layers.

The method then provides (at 1440) at least one solder resist layer and several solder balls.

Exemplary Sequence for Providing/Fabricating an Integrated Device that Includes a Passive Device In some implementations, providing/fabricating an integrated device with a passive device in a redistribution portion includes several processes. FIG. 15 (which includes FIGS. 15A-15E) illustrates an exemplary sequence for providing/fabricating an integrated device with a passive device in a redistribution portion. In some implementations, the sequence of FIGS. 15A-15E may be used to provide/fabricate the integrated device of FIGS. 10-11 and/or other integrated device in the present disclosure. However, for the purpose of simplification, FIGS. 15A-15E will be described in the context of providing/fabricating the integrated device of FIG. 10.

It should be noted that the sequence of FIGS. 15A-15E may combine one or more stages in order to simplify and/or clarify the sequence for providing an integrated device. In some implementations, the order of the processes may be changed or modified.

Figure 15A:
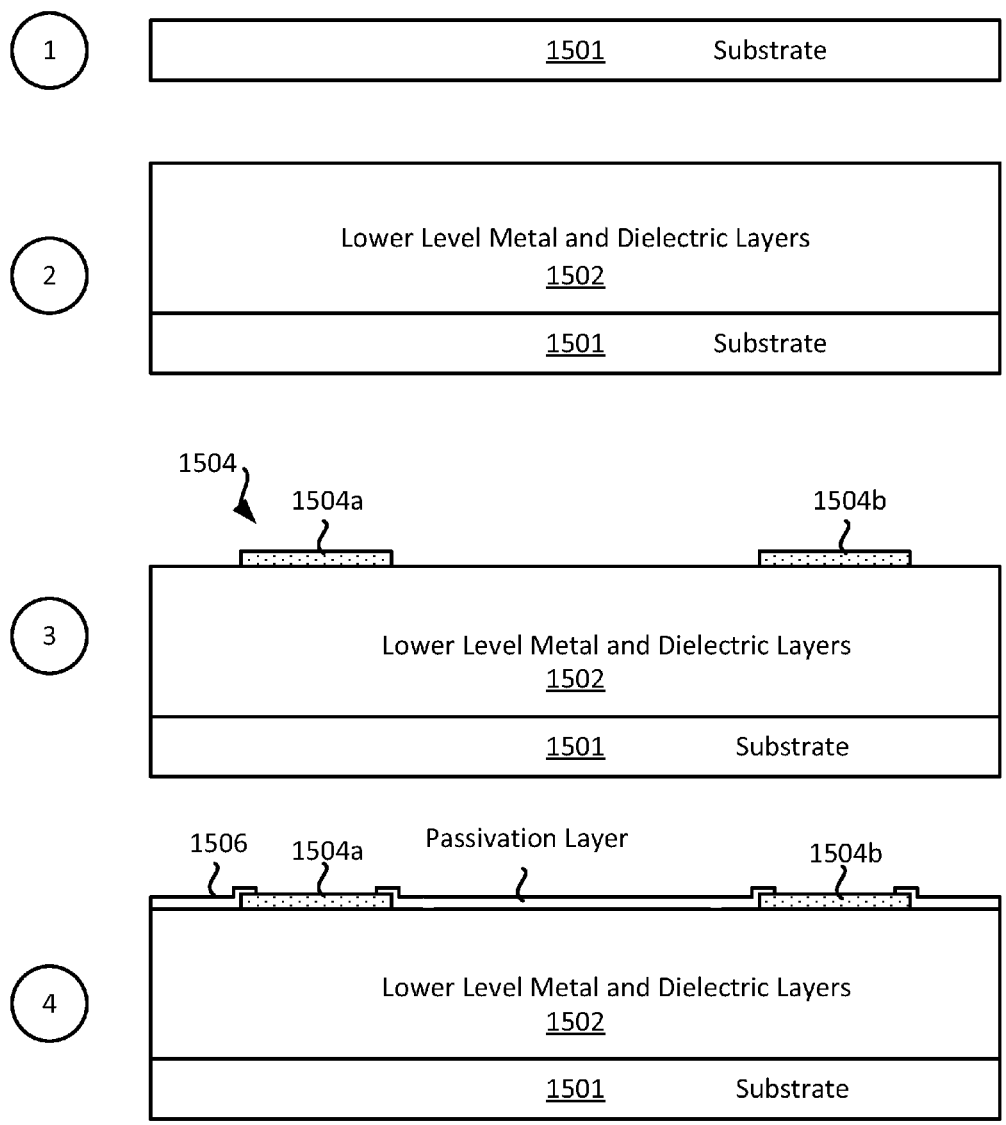
FIG. 15 (comprising 15A-15E) illustrates an exemplary sequence for providing/fabricating an integrated device that includes a passive device in a redistribution portion.

Stage 1 of FIG. 15A, illustrates a state after a substrate 1501 is provided. In some implementations, the substrate 1501 is provided by a supplier. In some implementations, the substrate 1501 is fabricated (e.g., formed). In some implementations, the substrate 1501 is a silicon substrate and/or wafer (e.g., silicon wafer).

Stage 2 illustrates a state after lower level metal and dielectric layers 1502 are provided. In some implementations, providing the lower level metal and dielectric layers 1502 include forming lower level metal layers (e.g., M1 metal layer, M2 metal layer, M3 metal layer, M4 metal layer, M5 metal layer, M6 metal layer, M7 metal layer). The lower metal layers of the lower level metal and dielectric layers 1502 include traces and/or vias. In some implementations, providing the lower level metal and dielectric layers 1502 include forming one or more dielectric layers. In some implementations, the lower level metal and dielectric layers 1502 are provided and/or formed using a back end of line (BEOL) process.

Stage 3 illustrates a state after a first metal layer 1504 is provided (e.g., formed) on the lower level metal and dielectric layers 1502. The first metal layer 1504 may form different components. For example, portions of the first metal layer 1504 may form the first pad 1104 and the second pad 1106 of FIG. 10. At show at stage 3, the first metal layer 1504 forms a first pad 1504a, and a second pad 1504b.

Stage 4 illustrates a state after a passivation layer 1506 is provided (e.g., formed) over the lower level metal and dielectric layers 1502 and the metal layer 1504. In some implementations, providing the passivation layer 1506 includes forming the passivation layer 1506 on the lower level metal and dielectric layers 1502 and the metal layer 1504 and selectively etching portions of the passivation layer 1506 over the metal layer 1504 (e.g., selectively etching portions of the passivation layer 1506 over of the pads).

Figure 15B:
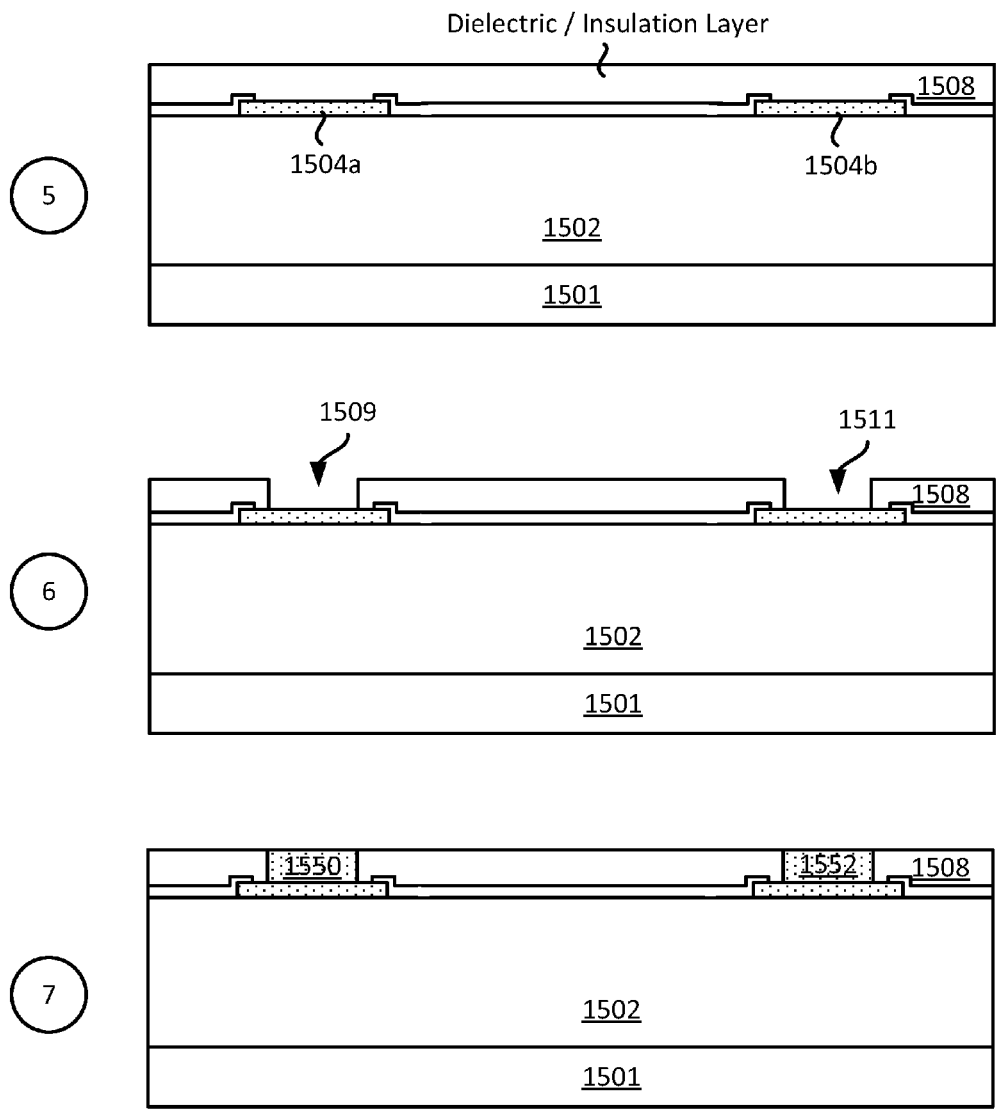

Stage 5, as shown in FIG. 15B, illustrates a state after a first dielectric layer 1508 is provided on the passivation layer 1506 and the metal layer 1504.

Stage 6 illustrates a state after portions of the first dielectric layer 1508 are selectively removed (e.g., etched). As shown at stage 6, portions of the first dielectric layer 1508 are selectively etched to form a cavity 1509 and a cavity 1511 in the first dielectric layer 1508 over the pads.

Stage 7 illustrates a state after a first via 1550 and a second via 1552 are respectively formed in the cavities 1509 and 1511. The first via 1550 is coupled to the pad 1504a, and the second via 1552 is coupled to the pad 1504b.

Figure 15C:
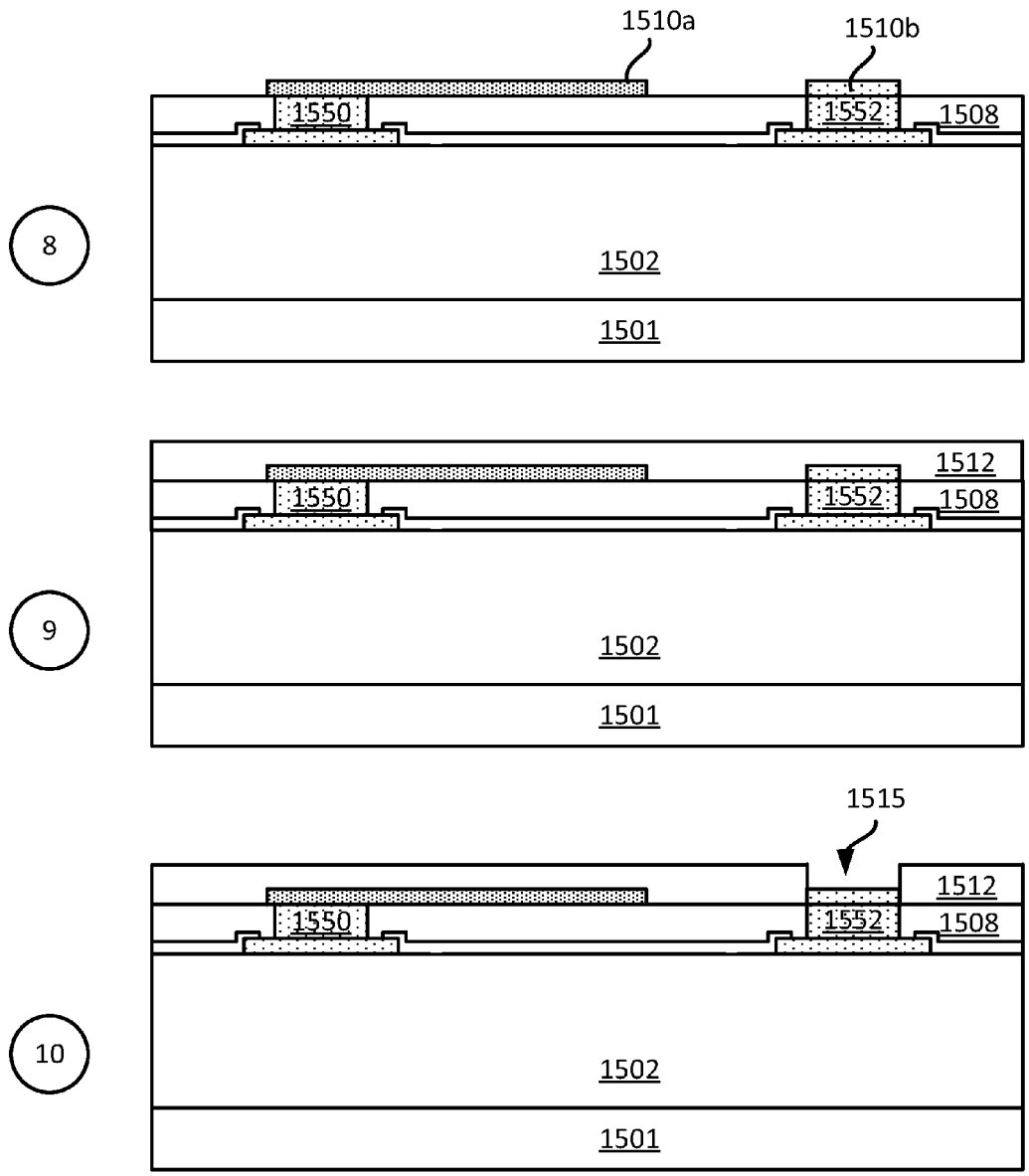

Stage 8, as shown in FIG. 15C, illustrates a state after a first redistribution layer 1510 is provided (e.g., formed) on the first dielectric layer 1508. As shown at stage 7, the first redistribution layer 1510 includes a first redistribution interconnect 1510*a* and a second interconnect 1510*b*. The first redistribution interconnect 1510*a* is coupled to the first via 1550. The second interconnect 1510*b* is formed on the second via 1552. In some implementations, the second interconnect 1510*b* is part of the second via 1552.

In some implementations, providing the first redistribution layer 1510 includes forming (e.g., plating) one or more metal layers (e.g., seed layer and metal layer) and selectively etching portions of the one or more metal layers. FIGS. 19-22 illustrate examples of providing one or more metal layers using several plating processes.

Stage 9 illustrates a state after a second dielectric layer 1512 is provided on the first dielectric layer 1508 and the first redistribution layer 1510.

Stage 10 illustrates a state after portions of the second dielectric layer 1512 are selectively removed (e.g., etched). As shown at stage 10, portions of the second dielectric layer 1512 are selectively etched to form a cavity 1513 in the second dielectric layer 1512 over the second interconnect 1510*b* and/or the second via 1552.

Figure 15D:
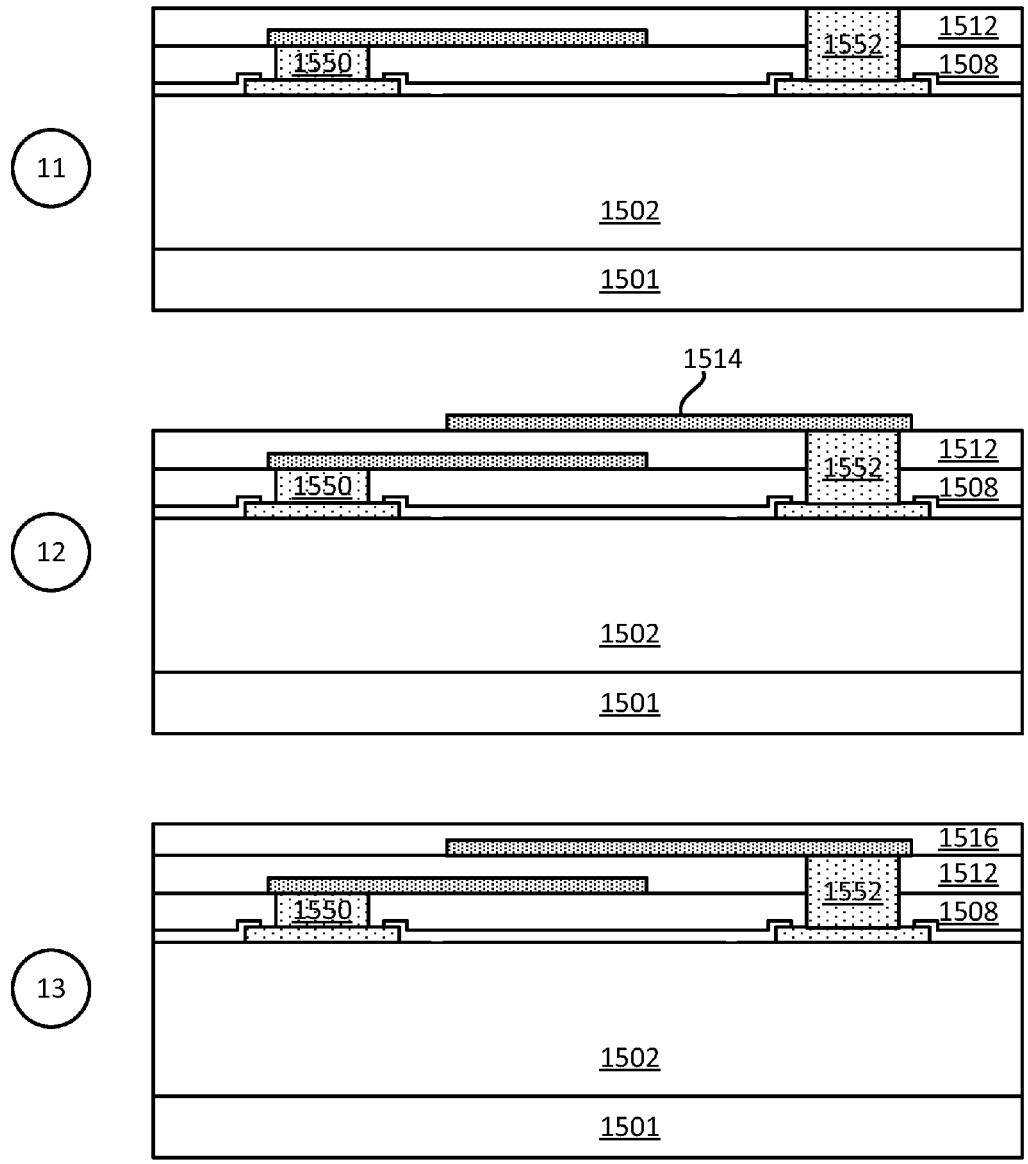

Stage 11, as shown in FIG. 15D, illustrates a state after a metal layer is formed in the cavity 1513 to further form and/or define the second via 1552.

Stage 12 illustrates a state after a second redistribution layer 1514 is provided (e.g., formed) on the second dielectric layer 1512. The second redistribution layer 1514 is coupled to the second interconnect 1510*b*. FIGS. 19-22 illustrate examples of providing one or more metal layers (e.g., redistribution layer) using several plating processes.

Stage 13 illustrates a state after a third dielectric layer 1516 is provided on the second dielectric layer 1512 and the second redistribution layer 1514.

Figure 15E:
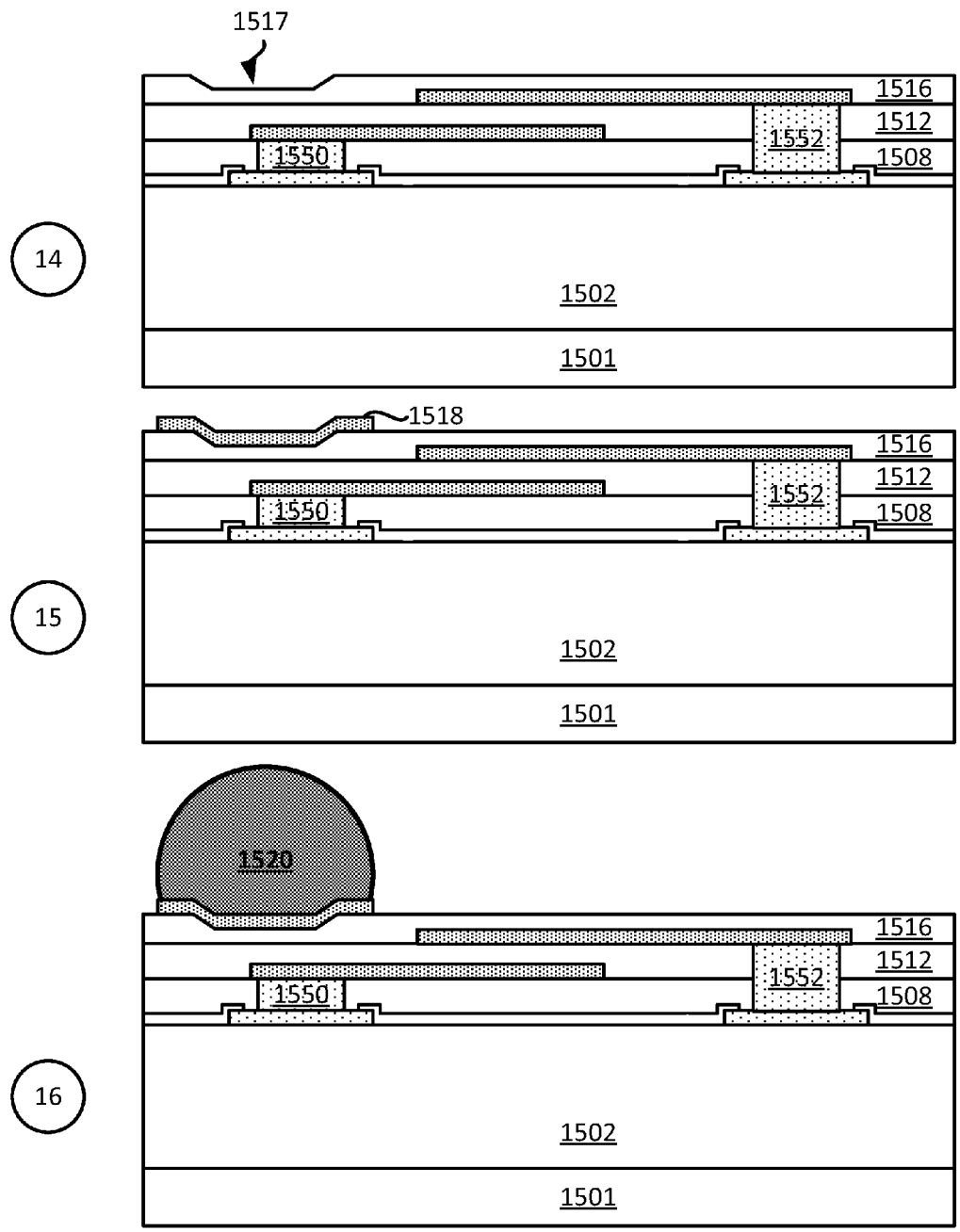

Stage 14, as shown in FIG. 15E, illustrates a state after portions of the third dielectric layer 1516 are selectively removed (e.g., etched). As shown at stage 12, portions of the third dielectric layer 1516 are selectively etched to form a cavity 1517 in the third dielectric layer 1516.

Stage 15 illustrates a state after an under bump metallization (UBM) layer 1518 is provided (e.g., formed) on the third dielectric layer 1516 and the second redistribution layer 1514. In some implementations, the UBM layer 1518 is optional. FIGS. 19-22 illustrate examples of providing one or more metal layers (e.g., UBM layer) using several plating processes.

Stage 16 illustrates a state after a solder ball 1520 is provided (e.g., coupled) to the UBM layer 1518. In some implementations, the UBM layer 1518 is optional. In such instances, the solder ball 1520 may be directly coupled to the second redistribution layer 1514.

Figure 16:
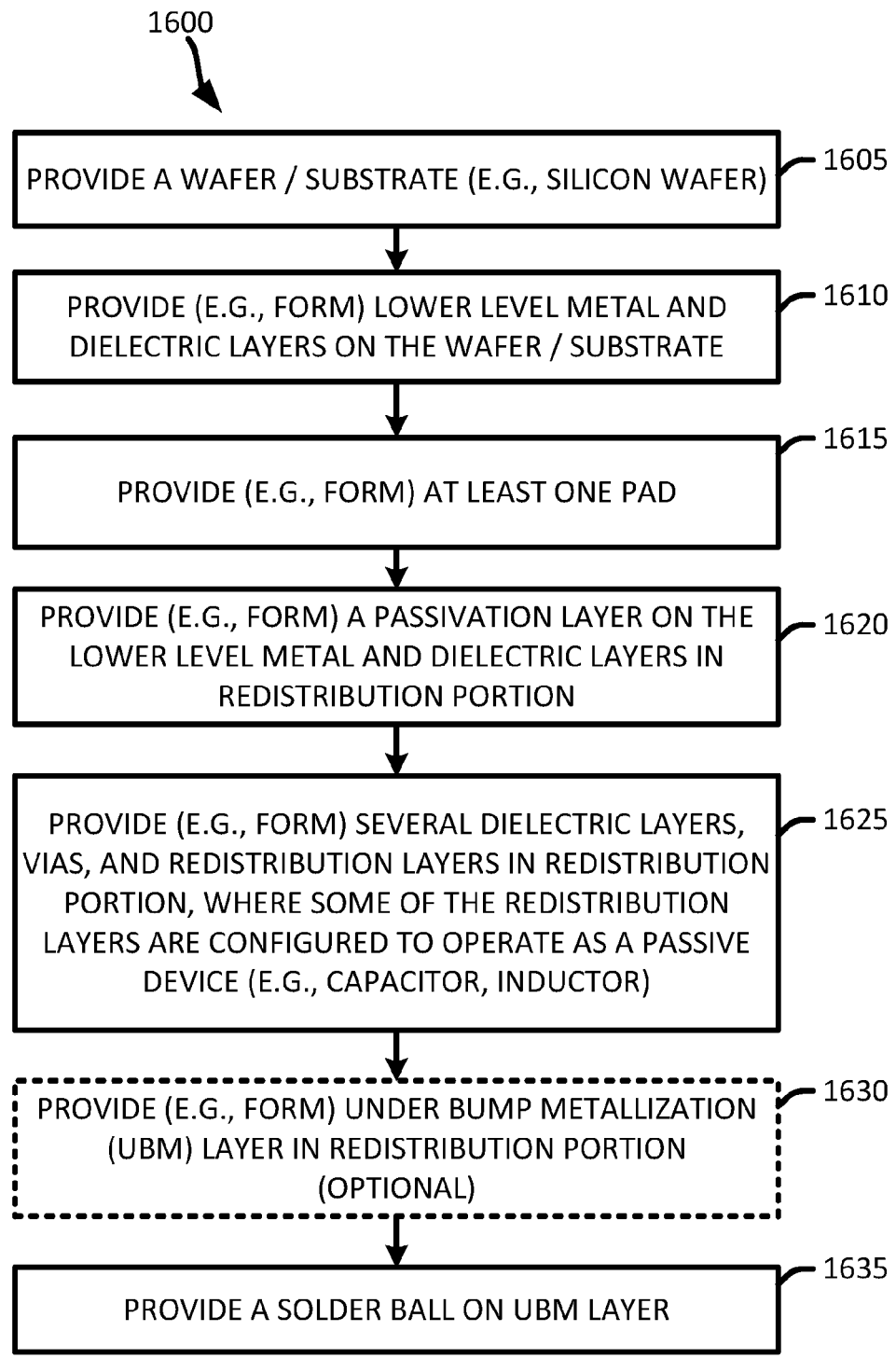
FIG. 16 illustrates an exemplary flow diagram of a method for providing/fabricating an integrated device that includes a passive device in a redistribution portion.

Exemplary Flow Diagram of a Method for Providing/Fabricating an Integrated Device that Includes a Passive Device In some implementations, providing/fabricating an integrated device with a passive device (e.g., capacitor, inductor) in a redistribution portion includes several processes. FIG. 16 illustrates an exemplary flow diagram of a method for providing/fabricating an integrated device with a passive device in a redistribution portion.

In some implementations, the method of FIG. 16 may be used to provide/fabricate the integrated device of FIGS. 10, 11, 12, and/or other integrated devices in the present disclosure. It should be noted that the method of FIG. 16 may combine one or more steps in order to simplify and/or clarify the sequence for providing an integrated device. In some implementations, the order of the processes may be changed or modified.

The method provides (at 1605) a substrate. In some implementations, the substrate is provided by a supplier. In some implementations, providing the substrate includes fabricating the substrate. In some implementations, the substrate is a silicon substrate and/or wafer (e.g., silicon wafer).

The method provides (at 1610) lower level metal and dielectric layers. In some implementations, providing the lower level metal and dielectric layers include forming lower level metal layers (e.g., M1 metal layer, M2 metal layer, M3 metal layer, M4 metal layer, M5 metal layer, M6 metal layer, M7 metal layer). The lower metal layers of the lower level metal and dielectric layers 1402 include traces and/or vias. In some implementations, providing the lower level metal and dielectric layers 1402 include forming one or more dielectric layers. In some implementations, the lower level metal and dielectric layers 1402 are provided and/or formed using a back end of line (BEOL) process.

The method provides (at 1615) a set of pads. In some implementations, the set of pads may be provided (e.g., formed) in a redistribution portion of an integrated device. The set of pads may be formed over the lower level metal and dielectric layers.

The method provides (at 1620) a passivation layer over the set of pads and the lower level metal and dielectric layers. In some implementations, providing (at 1620) the passivation layer includes forming the passivation layer on the lower level metal and dielectric layers and the metal layer (e.g., pads) and selectively etching portions of the passivation layer over the metal layer (e.g., selectively etching portions of the passivation layer over of the pads).

The method then provides (at 1625) several dielectric layers and several redistribution metal layers, where at least some of the redistribution layers are configured to operate as a passive device (e.g., capacitor, inductor).

The method optionally provides (at 1630) an under bump metallization (UBM) layer. In some implementations, providing the UBM layer includes forming the UBM layer such that the UBM layer is coupled to one of the redistribution layer.

The method then provides (at 1635) a solder ball on the UBM layer. In some implementations, the UBM layer is optional. In such instances, the solder ball may be directly coupled to a redistribution layer.

Exemplary Sequence for Providing/Fabricating a Die that Includes a Passive Device FIG. 17 (which includes FIGS. 17A-17D) illustrates an exemplary sequence for providing and/or fabricating an integrated device that includes a passive device (e.g., capacitor, inductor). In some implementations, the sequence of FIGS. 17A-17D may be used to provide and/or fabricate the integrated devices of FIGS. 10-12 and/or other integrated devices described in the present disclosure.

Figure 17A:
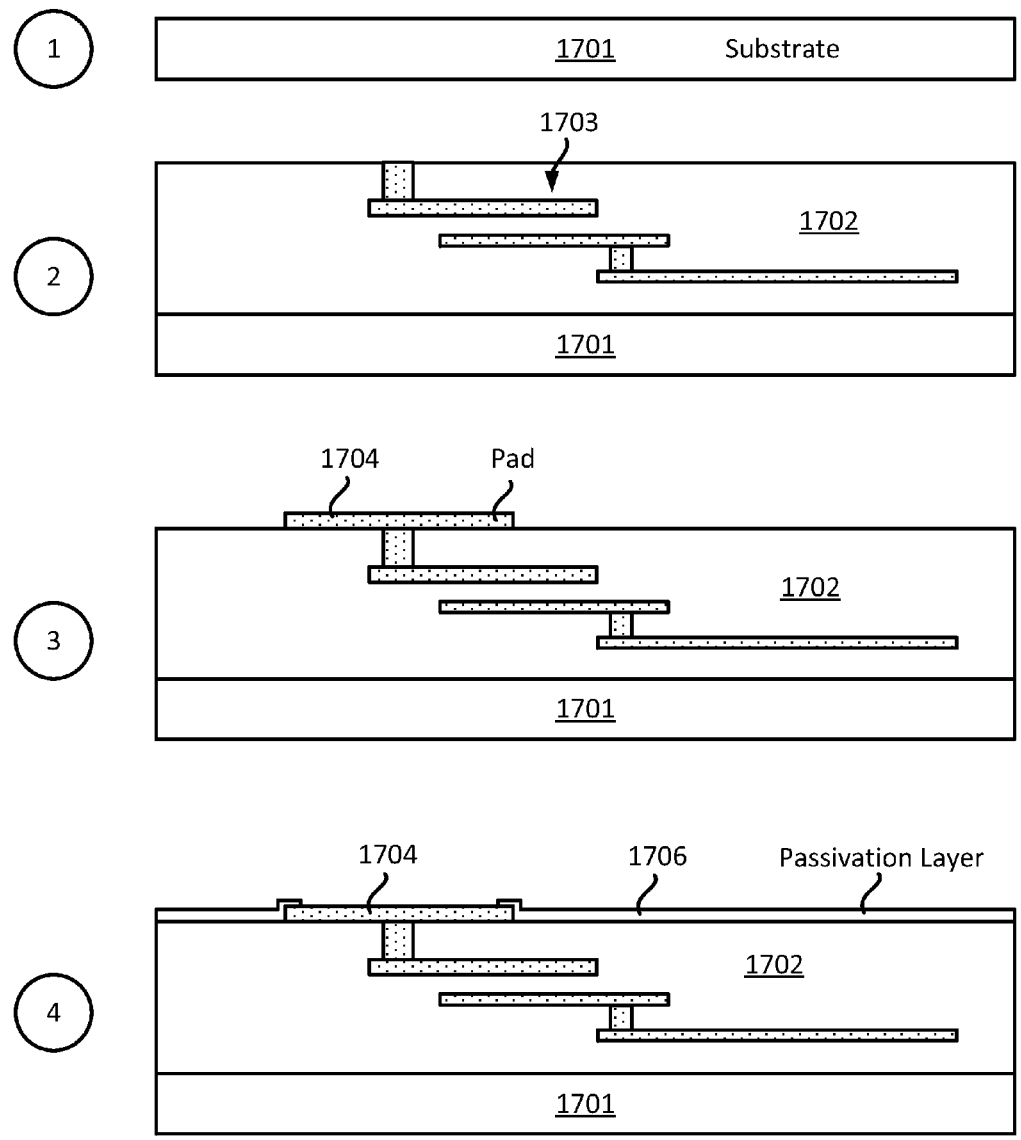
FIG. 17 (comprising FIGS. 17A-17D) illustrates an example of a sequence for fabricating an integrated device that includes a passive device.

Stage 1 of FIG. 17A, illustrates a stage after a substrate (e.g., substrate 1701) is provided (e.g., formed, fabricated). In some implementations, the substrate is a wafer. Different implementations may use different materials for the substrate (e.g., silicon substrate, glass substrate).

Stage 2 illustrates a state after several lower level metal and dielectric layers (e.g., lower level metal and dielectric layers 1702) are provided (e.g., formed, fabricated) on the substrate 1701. Different implementations may provide different number of lower level metal and dielectric layers (e.g., M1 metal layer, M2 metal layer, M3 metal layer, M4 metal layer, M5 metal layer, M6 metal layer, M7 metal layer). In some implementations, circuits, routes and/or interconnects are also provided in the substrate 1701 and/or the lower level metal and dielectric layers 1702. As shown in stage 2, a passive device 1703 is provided in the lower level metal and dielectric layers 1702. In some implementations, the passive device 1703 is metal-insulator-metal (MIM) capacitor as shown in FIG. 12. However, in some implementations, the passive device 1703 can be other types of capacitors, such as the metal-on-metal (MOM) capacitor.

Stage 3 illustrates a state after at least one pad (e.g., pad 1704) is provided (e.g., formed, fabricated) on the lower level metal and dielectric layers 1702. In some implementations, the pad is coupled to one of the lower level metal layer (e.g., the top lower level metal layer, M7 metal layer). In some implementations, the pad 1704 is an aluminum pad. However, different implementations may use different materials for the pad 1704. Different implementations may use different processes for providing the pad on the lower level metal and dielectric layers 1702. For example, in some implementations, a lithography and/or etching process may be use to provide the pad 1704 on the lower level metal and dielectric layers 1702.

Stage 4 illustrates a state after a passivation layer (e.g., passivation layer 1706) is provided (e.g., formed, fabricated) on the lower level metal and dielectric layers 1702. Different implementations may use different materials for the passivation layer. As shown in stage 4, the passivation layer 1706 is provided on the lower level metal and dielectric layers 1702 such that at least a portion of the pad 1704 is exposed.

Figure 17B:
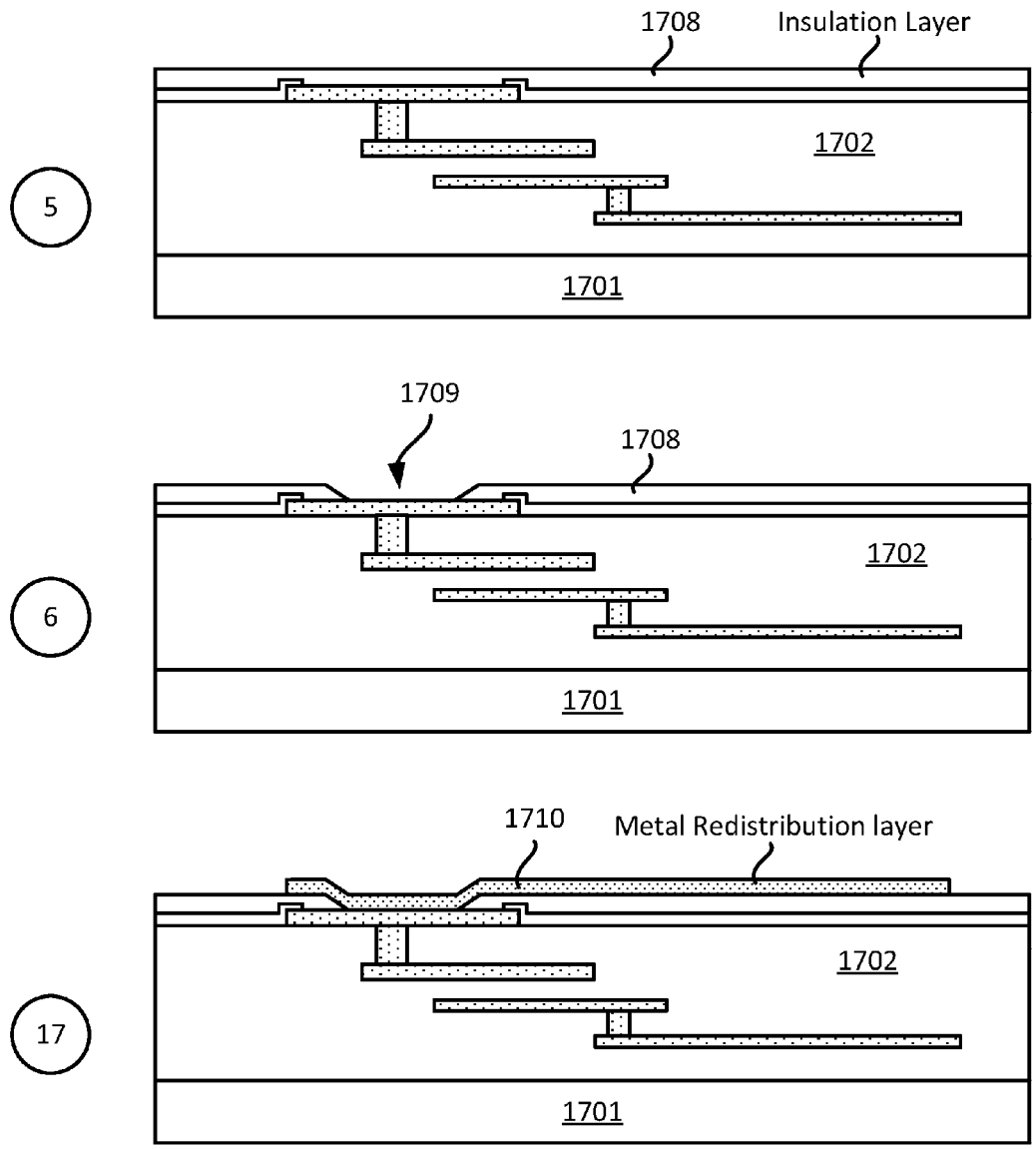

Stage 5 of FIG. 17B, illustrates a state after a first insulation layer (e.g., first insulation layer 1708) is provided (e.g., formed, fabricated) on the passivation layer 1706 and the pad 1704. Different implementations may use different materials for the first insulation layer 1708. For example, the first insulation layer 1708 may be a Polybenzoxazole (PbO) layer or a polymer layer.

Stage 6 illustrates a state after a cavity (e.g., cavity 1709) is provided (e.g., formed, fabricated) in the first insulation layer 1708. As further shown in stage 6, the cavity 1709 is created over the pad 1704. Different implementations may create the cavity 1709 differently. For example, the cavity 1709 may be provided/created by etching the first insulation layer 1708.

Stage 7 illustrates a state after a first metal redistribution layer is provided (e.g., formed, fabricated). Specifically, a first metal redistribution layer 1710 is provided over the pad 1704 and the first insulation layer 1708. As shown in stage 17, the first metal redistribution layer 1710 is coupled to the pad 1704. In some implementations, the first metal redistribution layer 1710 is a copper layer.

Figure 17C:
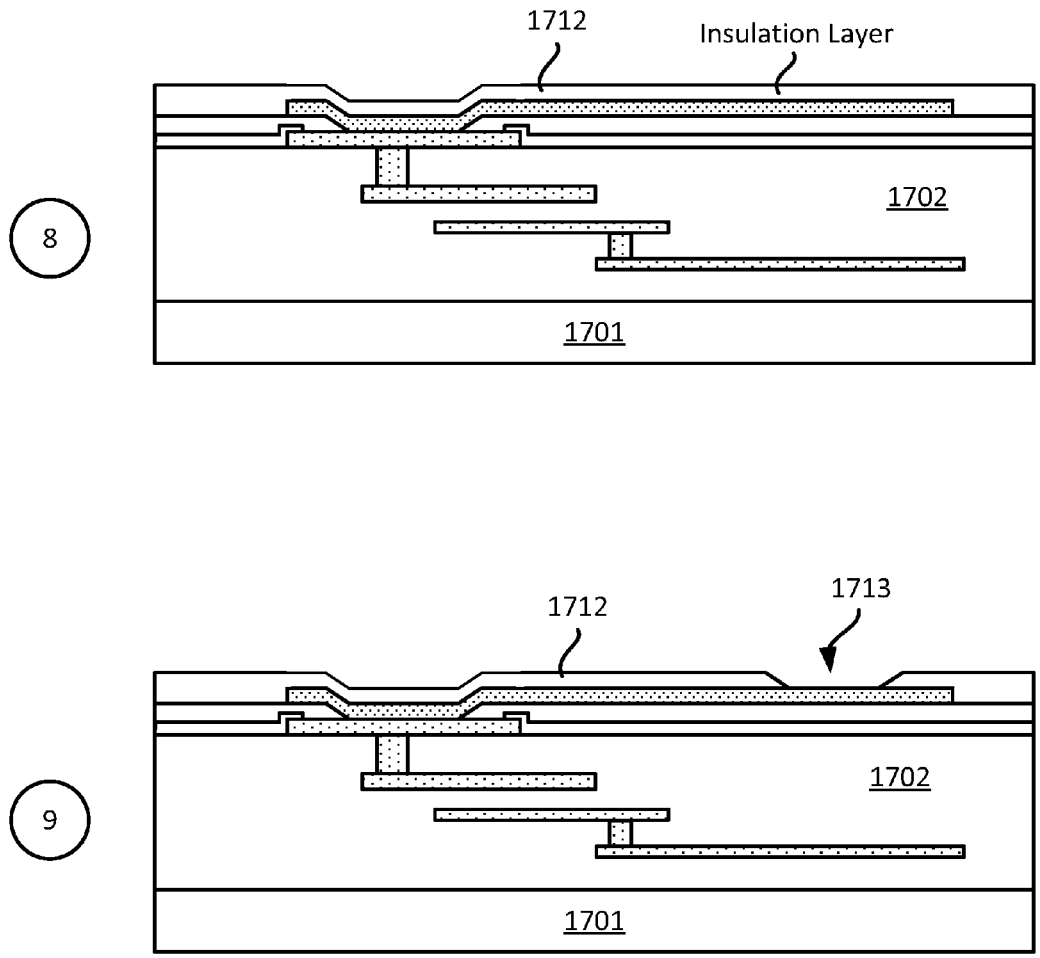
Figure 17D:
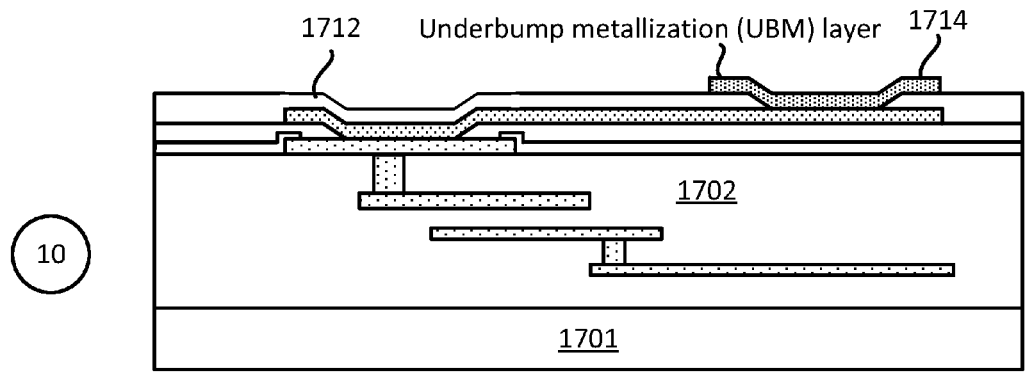
Figure 17D:
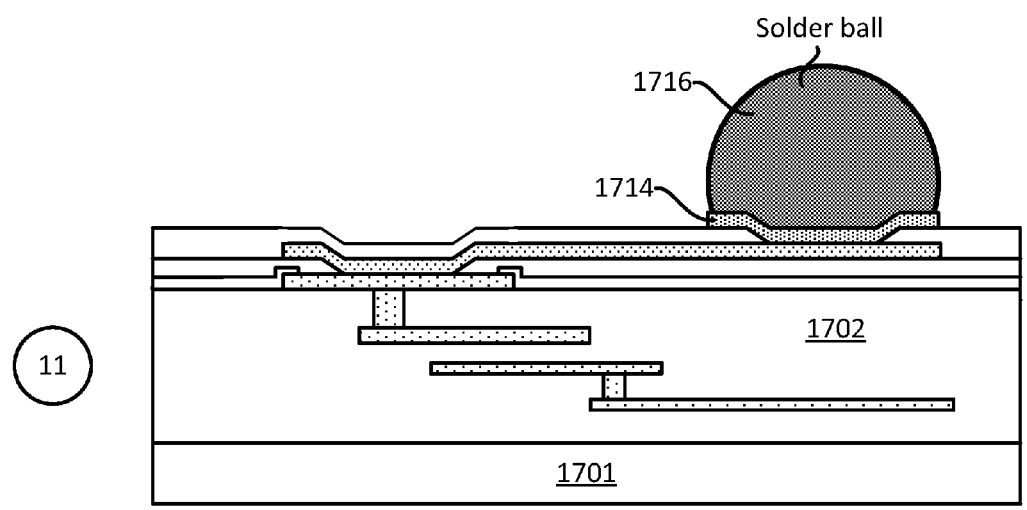

Stage 8 of FIG. 17C, illustrates a state after a second insulation layer (e.g., second insulation layer 1712) is provided (e.g., formed, fabricated) on the first insulation layer 1708 and the first metal redistribution layer 1710. Different implementations may use different materials for the second insulation layer 1712. For example, the second insulation layer 1712 may be a Polybenzoxazole (PbO) layer or a polymer layer.

Stage 9 illustrates a state after a cavity (e.g., cavity 1713) is provided (e.g., formed, fabricated) in the second insulation layer 1712. Different implementations may create the cavity 1713 differently. For example, the cavity 1713 may be provided/created by etching the second insulation layer 1712.

Stage 10 illustrates a state after an under bump metallization (UBM) layer is provided (e.g., formed, fabricated). Specifically, an under bump metallization (UBM) layer 1714 is provided in the cavity 1713 of the second insulation layer 1712. As shown at stage 21, the UBM layer 1714 is coupled to the first metal redistribution layer 1710. In some implementations, the UBM layer 1714 is a copper layer.

Stage 11 illustrates a state after a solder ball is provided on the UBM layer. Specifically, a solder ball 1716 is coupled to the UBM layer 1714. In some implementations, the solder ball 1716, the UBM layer 1714, and/or the redistribution layer 1710 is part of an inductor in the integrated device.

Figure 18:
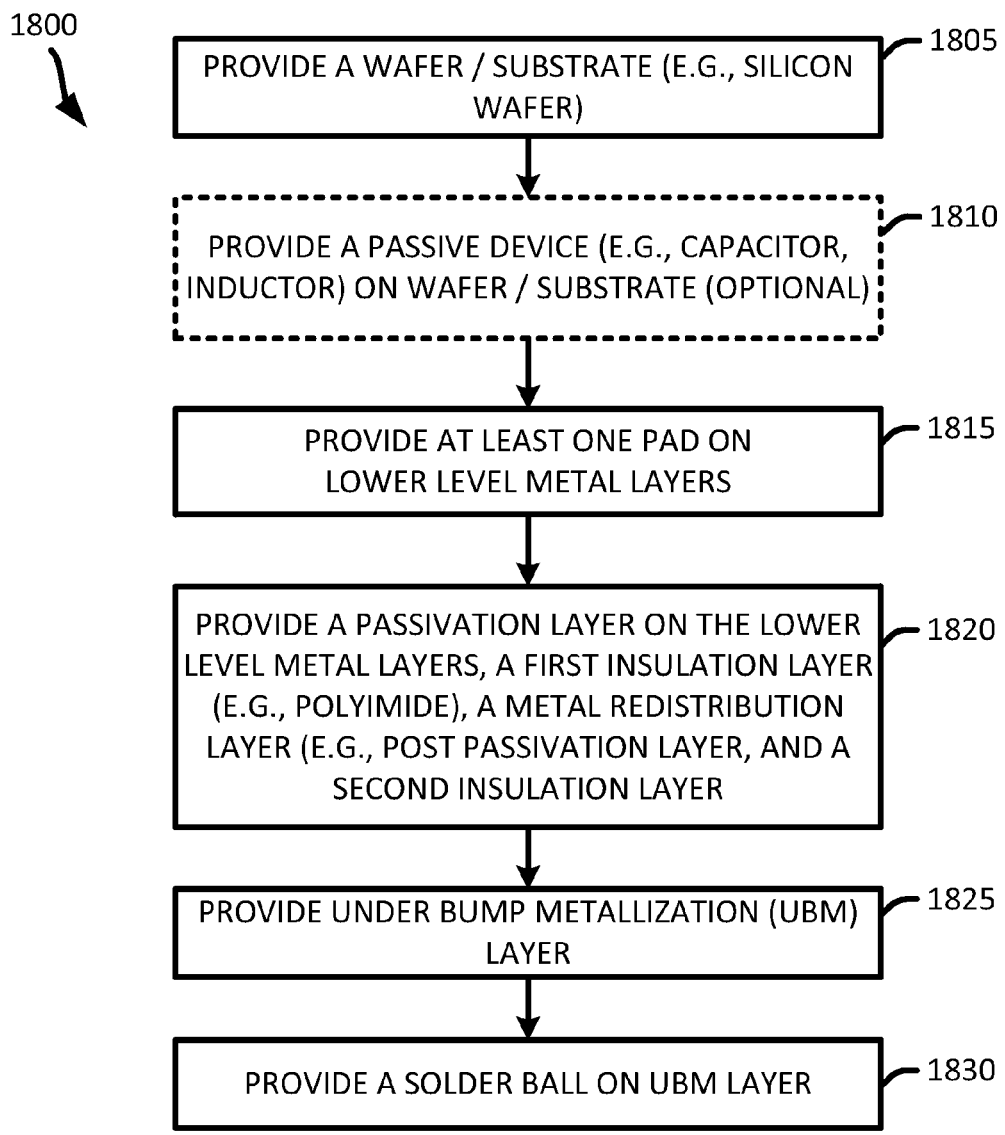
FIG. 18 illustrates a flow diagram of a method for fabricating an integrated device that includes a capacitor.

Exemplary Flow Diagram of a Method for Providing/Fabricating a Die that Includes a Passive Device FIG. 18 illustrates an exemplary flow diagram of a method for providing and/or fabricating an integrated device that includes a capacitor. In some implementations, the flow diagram of FIG. 18 may be used to provide and/or fabricate the integrated devices of FIG. 12 or other integrated devices described in the present disclosure.

The method provides (at 1805) a substrate. In some implementations, providing (at 1805) the substrate includes providing a wafer (e.g., silicon wafer). However, different implementations may use different materials for the substrate (e.g., glass substrate). The method then optionally provides (at 1810) a capacitor (e.g., MIM capacitor, MOM capacitor) in lower level metal layers.

The method further provides (at 1815) at least one pad on one of the lower level metal and dielectric layers (e.g., M7 metal layer). In some implementations, providing (at 1815) the pad includes coupling the pad to one of the lower level metal layer (e.g., the top lower level metal layer, M7 metal layer). In some implementations, the pad is an aluminum pad. However, different implementations may use different materials for the pad. In addition, different implementations may use different processes for providing the pad on the lower level metal and dielectric layers. For example, in some implementations, a lithography and/or etching process may be use to provide (at 1815) the pad on the lower level metal and dielectric layers.

The method provides (at 1820) a passivation layer (e.g., passivation layer 1706), a first insulation layer (e.g., first insulation layer 1708), a redistribution layer (e.g., redistribution layer 1710), and a second insulation layer (e.g., second insulation layer 1712). Different implementations may use different materials for the passivation layer. In some implementations, the passivation layer is provided on the lower level metal and dielectric layers such that at least a portion of the pad is exposed. In some implementations, the metal redistribution layer is provided over the pad and the first insulation layer. In some implementations, the metal redistribution layer is coupled to the pad. In some implementations, the metal redistribution layer is a copper layer.

Different implementations may use different materials for the first and second insulation layers. For example, the first and second insulation layers may be a Polybenzoxazole (PbO) layer and/or a polymer layer.

The method then provides (at 1825) an under bump metallization (UBM) layer. In some implementations, providing (at 1825) the UBM layer includes coupling the UBM layer to the metal redistribution layer. In some implementations, the UBM layer is a copper layer. The method further provides (at 1835) a solder ball on the UBM layer.

Exemplary Semi-Additive Patterning (SAP) Process

Various interconnects (e.g., traces, vias, pads) are described in the present disclosure. These interconnects may be formed in the package substrate, printed circuit board (PCB) and/or the redistribution portion of an integrated device. In some implementations, these interconnects may includes one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes.

Different implementations may use different processes to form and/or fabricate the metal layers (e.g., interconnects, redistribution layer, under bump metallization layer). In some implementations, these processes include a semi-additive patterning (SAP) process and a damascene process. These various different processes are further described below.

Figure 19:
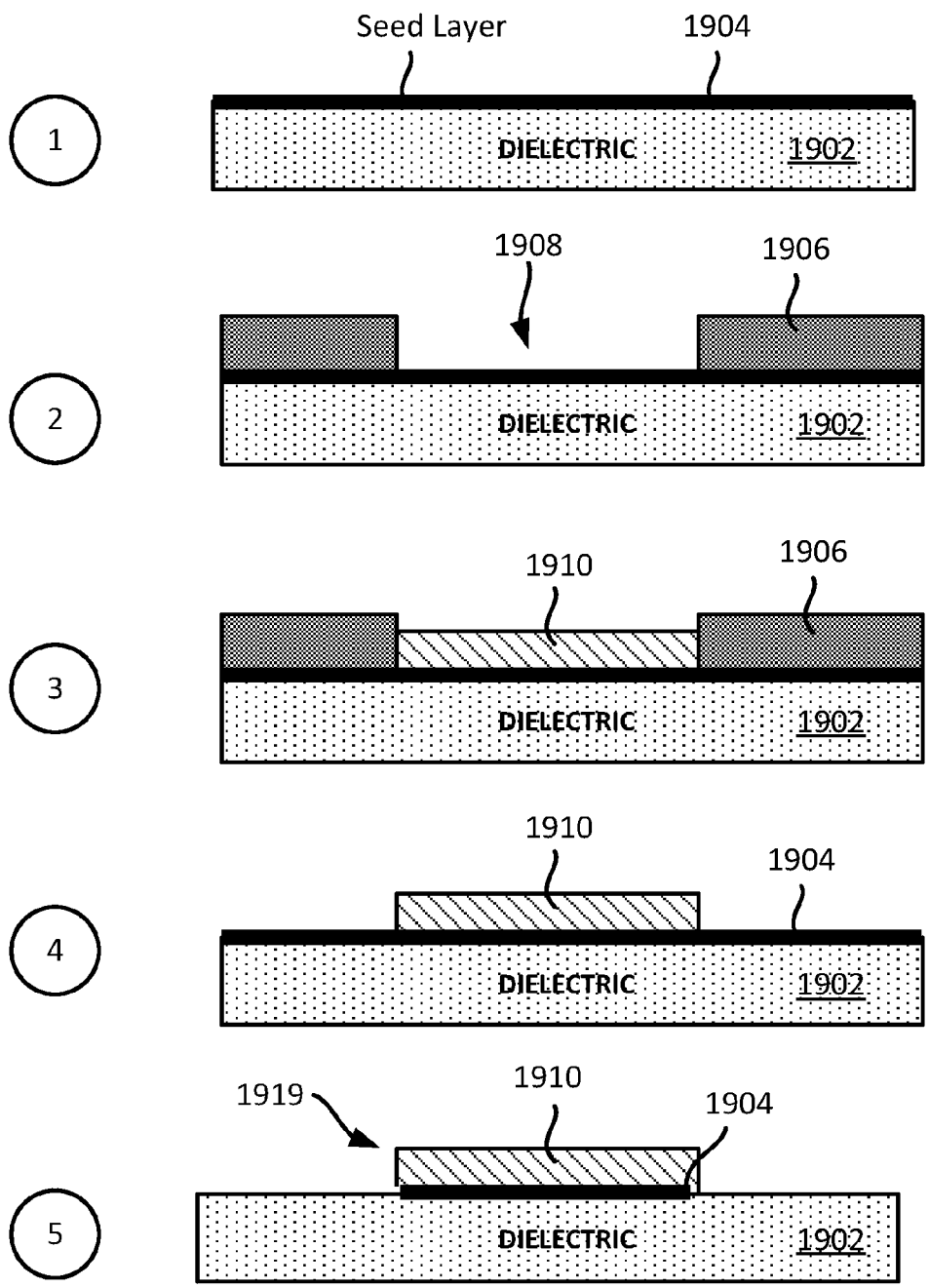
FIG. 19 illustrates an example of a semi-additive patterning (SAP) process.

FIG. 19 illustrates a sequence for forming an interconnect using a semi-additive patterning (SAP) process to provide and/or form an interconnect in one or more dielectric layer(s). As shown in FIG. 19, stage 1 illustrates a state of an integrated device (e.g., substrate) after a dielectric layer 1902 is provided (e.g., formed). In some implementations, stage 1 illustrates that the dielectric layer 1902 includes a first metal layer 1904. The first metal layer 1904 is a seed layer in some implementations. In some implementations, the first metal layer 1904 may be provided (e.g., formed) on the dielectric layer 1902 after the dielectric layer 1902 is provided (e.g., received or formed). Stage 1 illustrates that the first metal layer 1904 is provided (e.g., formed) on a first surface of the dielectric layer 1902. In some implementations, the first metal layer 1904 is provided by using a deposition process (e.g., PVD, CVD, plating process).

Stage 2 illustrates a state of the integrated device after a photo resist layer 1906 (e.g., photo develop resist layer) is selectively provided (e.g., formed) on the first metal layer 1904. In some implementations, selectively providing the resist layer 1906 includes providing a first resist layer 1906 on the first metal layer 1904 and selectively removing portions of the resist layer 1906 by developing (e.g., using a development process). Stage 2 illustrates that the resist layer 1906 is provided such that a cavity 1908 is formed.

Stage 3 illustrates a state of the integrated device after a second metal layer 1910 is formed in the cavity 1908. In some implementations, the second metal layer 1910 is formed over an exposed portion of the first metal layer 1904. In some implementations, the second metal layer 1910 is provided by using a deposition process (e.g., plating process).

Stage 4 illustrates a state of the integrated device after the resist layer 1906 is removed. Different implementations may use different processes for removing the resist layer 1906.

Stage 5 illustrates a state of the integrated device after portions of the first metal layer 1904 are selectively removed. In some implementations, one or more portions of the first metal layer 1904 that is not covered by the second metal layer 1910 is removed. As shown in stage 5, the remaining first metal layer 1904 and the second metal layer 1910 may form and/or define an interconnect 1912 (e.g., trace, vias, pads) in an integrated device and/or a substrate. In some implementations, the first metal layer 1904 is removed such that a dimension (e.g., length, width) of the first metal layer 1904 underneath the second metal layer 1910 is smaller than a dimension (e.g., length, width) of the second metal layer 1910, which can result in an undercut, as shown at stage 5 of FIG. 19. In some implementations, the above mentioned processes may be iterated several times to provide and/or form several interconnects in one or more dielectric layers of an integrated device and/or substrate.

Figure 20:
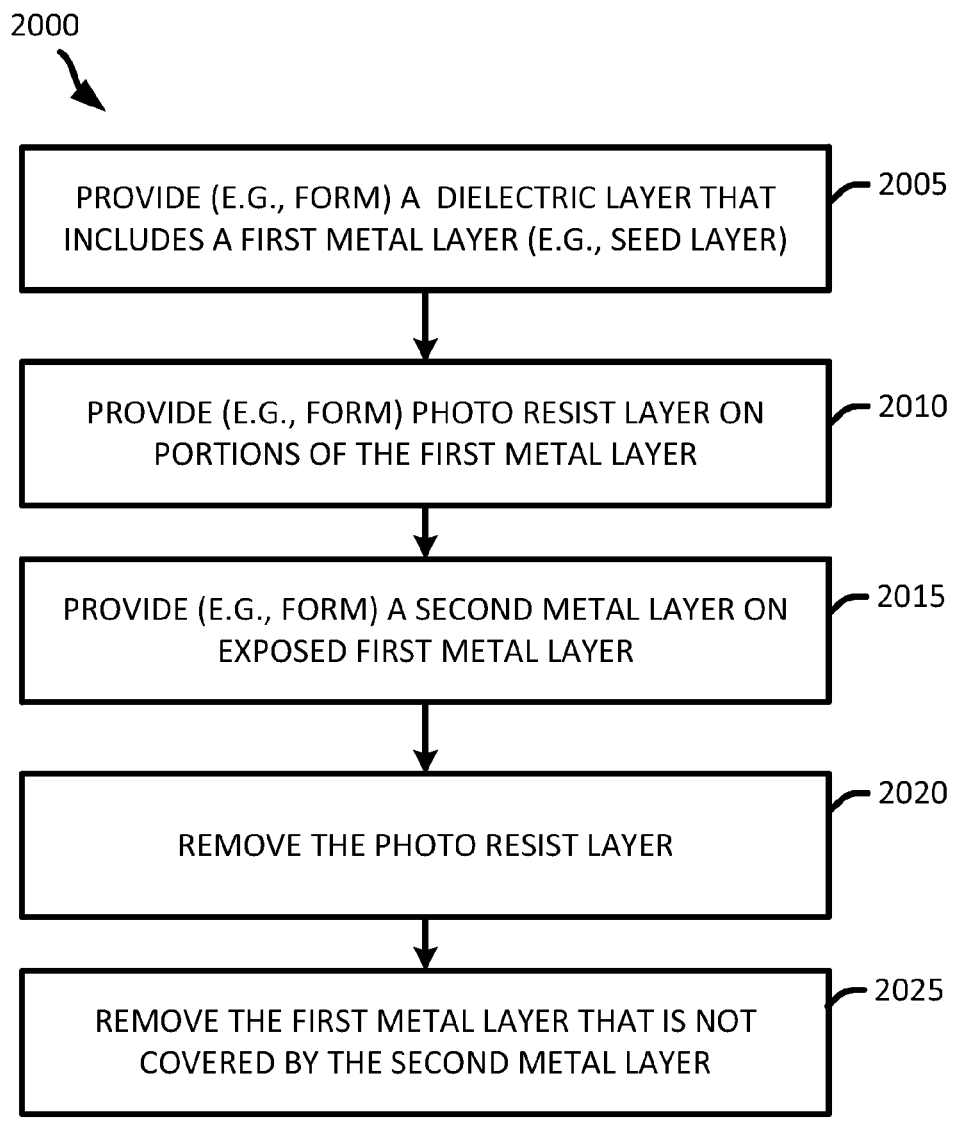
FIG. 20 illustrates an example of flow diagram of a semi-additive patterning (SAP) process.

FIG. 20 illustrates a flow diagram for a method for using a (SAP) process to provide and/or form an interconnect in one or more dielectric layer(s). The method provides (at 2005) a dielectric layer (e.g., dielectric layer 1802). In some implementations, providing the dielectric layer includes forming the dielectric layer. In some implementations, providing the dielectric layer includes forming a first metal layer (e.g., first metal layer 1804). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 2010) a photo resist layer (e.g., a photo develop resist layer 1806) on the first metal layer. In some implementations, selectively providing the resist layer includes providing a first resist layer on the first metal layer and selectively removing portions of the resist layer (which provides one or more cavities).

The method then provides (at 2015) a second metal layer (e.g., second metal layer 1810) in the cavity of the photo resist layer. In some implementations, the second metal layer is formed over an exposed portion of the first metal layer. In some implementations, the second metal layer is provided by using a deposition process (e.g., plating process).

The method further removes (at 2020) the resist layer. Different implementations may use different processes for removing the resist layer. The method also selectively removes (at 2025) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 21:
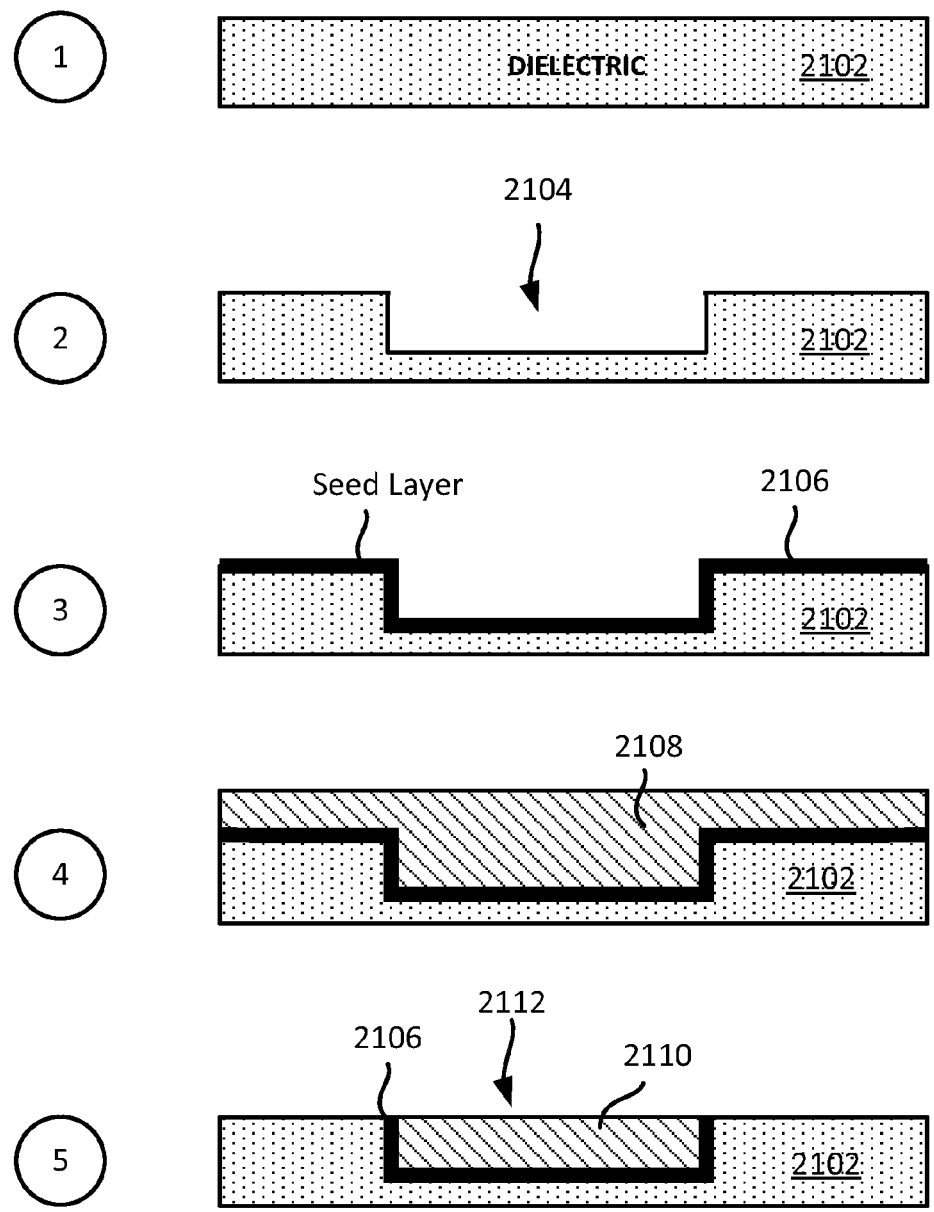
FIG. 21 illustrates an example of a damascene process.

FIG. 21 illustrates a sequence for forming an interconnect using a damascene process to provide and/or form an interconnect in a dielectric layer. As shown in FIG. 21, stage 1 illustrates a state of an integrated device after a dielectric layer 2102 is provided (e.g., formed). In some implementations, the dielectric layer 2102 is an inorganic layer (e.g., inorganic film).

Stage 2 illustrates a state of an integrated device after a cavity 2104 is formed in the dielectric layer 2102. Different implementations may use different processes for providing the cavity 2104 in the dielectric layer 2102.

Stage 3 illustrates a state of an integrated device after a first metal layer 2106 is provided on the dielectric layer 2102. As shown in stage 3, the first metal layer 2106 provided on a first surface of the dielectric later 2102. The first metal layer 2106 is provided on the dielectric layer 2102 such that the first metal layer 2106 takes the contour of the dielectric layer 2102 including the contour of the cavity 2104. The first metal layer 2106 is a seed layer in some implementations. In some implementations, the first metal layer 2106 is provided by using a deposition process (e.g., physical vapor deposition (PVD), Chemical Vapor Deposition (CVP) or plating process).

Stage 4 illustrates a state of the integrated device after a second metal layer 2108 is formed in the cavity 2104 and a surface of the dielectric layer 2102. In some implementations, the second metal layer 2108 is formed over an exposed portion of the first metal layer 2106. In some implementations, the second metal layer 2108 is provided by using a deposition process (e.g., plating process).

Stage 5 illustrates a state of the integrated device after the portions of the second metal layer 2108 and portions of the first metal layer 2106 are removed. Different implementations may use different processes for removing the second metal layer 2108 and the first metal layer 2106. In some implementations, a chemical mechanical planarization (CMP) process is used to remove portions of the second metal layer 2108 and portions of the first metal layer 2106. As shown in stage 5, the remaining first metal layer 2106 and the second metal layer 2108 may form and/or define an interconnect 2112 (e.g., trace, vias, pads) in an integrated device and/or a substrate. As shown in stage 5, the interconnect 2112 is formed in such a way that the first metal layer 2106 is formed on the base portion and the side portion(s) of the second metal layer 2110. In some implementations, the cavity 2104 may include a combination of trenches and/or holes in two levels of dielectrics so that via and interconnects (e.g., metal traces) may be formed in a single deposition step, In some implementations, the above mentioned processes may be iterated several times to provide and/or form several interconnects in one or more dielectric layers of an integrated device and/or substrate.

Figure 22:
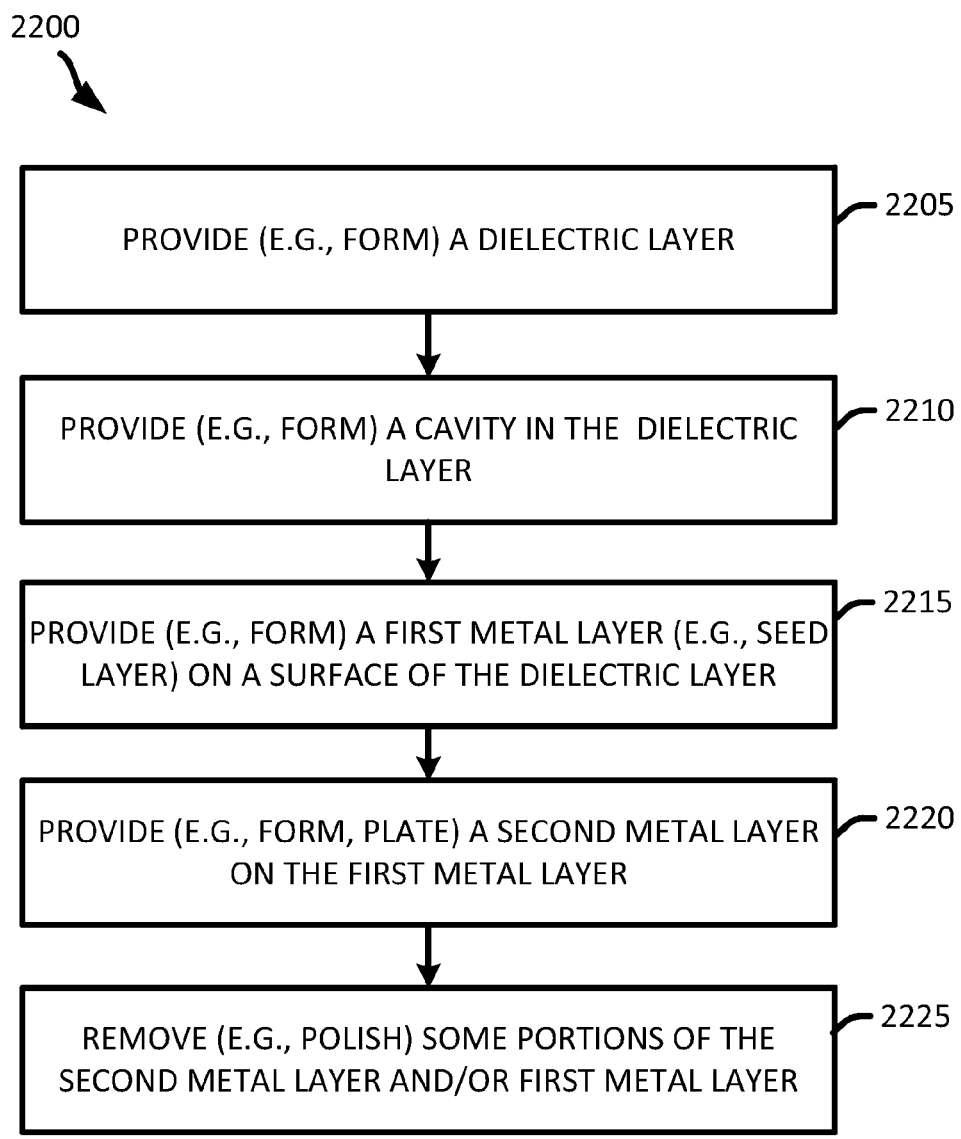
FIG. 22 illustrates an example of a flow diagram of a damascene process.

FIG. 22 illustrates a flow diagram of a method for forming an interconnect using a damascene process to provide and/or form an interconnect in a dielectric layer. The method provides (at 2205) a dielectric layer (e.g., dielectric layer 2102). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 2210) at least one cavity (e.g., cavity 2104) in the dielectric layer. Different implementations may use different processes for providing the cavity in the dielectric layer.

The method provides (at 2215) a first metal layer (e.g., first metal layer 2106) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 2106 is provided by using a deposition process (e.g., PVD, CVD or plating process).

The method provides (at 2220) a second metal layer (e.g., second metal layer 2108) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 2225) portions of the second metal layer and portions of the first metal layer. Different implementations may use different processes for removing the second metal layer and the first metal layer. In some implementations, a chemical mechanical planarization (CMP) process is used to remove portions of the second metal layer and portions of the first metal layer. In some implementations, the remaining first metal layer and the second metal layer may form and/or define an interconnect (e.g., interconnect 2112). In some implementations, an interconnect may include one of at least a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

Figure 23:
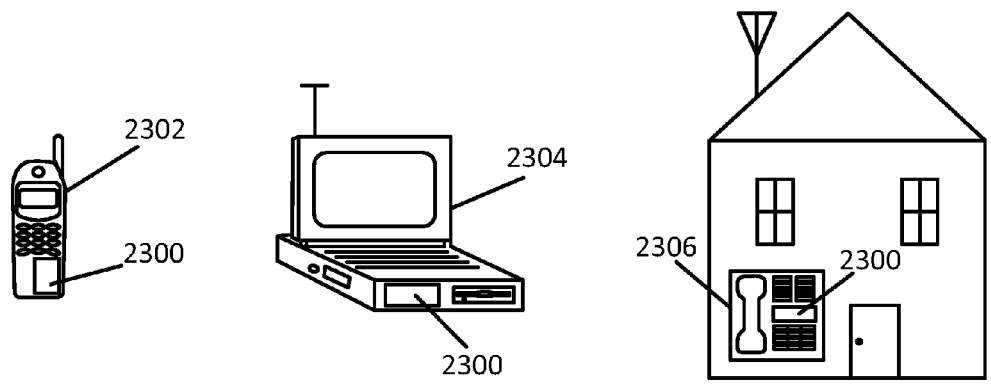
FIG. 23 illustrates various electronic devices that may integrate a semiconductor device, a die, an integrated circuit and/or PCB described herein.

FIG. 23 illustrates various electronic devices that may be integrated with any of the aforementioned integrated device, semiconductor device, integrated circuit, die, interposer, package or package-on-package (PoP). For example, a mobile telephone 2302, a laptop computer 2304, and a fixed location terminal 2306 may include an integrated device 2300 as described herein. The integrated device 2300 may be, for example, any of the integrated circuits, dice, packages, package-on-packages described herein. The devices 2302, 2304, 2306 illustrated in FIG. 23 are merely exemplary. Other electronic devices may also feature the integrated device 2300 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof One or more of the components, steps, features, and/or functions illustrated in FIGS. 2, 3, 4, 5, 6, 7, 8, 9, 10, 11, 12, 13A-13C, 14, 15A-15E, 16, 17A-17D, 18, 19, 20, 21, 22 and/or 23 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12, 13A-13C, 14, 15A-15E, 16, 17A-17D, 18, 19, 20, 21, 22 and/or 23 and its corresponding description in the present disclosure is not limited to dies and/or ICs. In some implementations, FIGS. 2, 3, 4, 5, 6, 7, 8, 9, 10, 11, 12, 13A-13C, 14, 15A-15E, 16, 17A-17D, 18, 19, 20, 21, 22 and/or 23 and its corresponding description may be used to manufacture, create, provide, and/or produce integrated devices. In some implementations, an integrated device may include a die, a die package, an integrated circuit (IC), an integrated package device, a wafer, a semiconductor device, a package on package, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another— even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package substrate comprising:
   at least one dielectric layer;
   a first inductor structure at least partially located in the dielectric layer, the first inductor structure comprising:
      a first interconnect;
      a first via coupled to the first interconnect; and
      a second interconnect coupled to the first via;
   a third interconnect coupled to the first inductor structure, the third interconnect configured to provide an electrical path for a ground signal; and
   a second inductor structure at least partially located in the dielectric layer, the second inductor coupled to the third interconnect, the second inductor structure comprising:
      a fourth interconnect;
      a second via coupled to the fourth interconnect; and
      a fifth interconnect coupled to the second via.

2. The package substrate of claim 1, wherein the first inductor structure and the second inductor structure are inductor structures from a plurality of inductor structures in the package substrate, the plurality of inductor structures arranged in an array configuration.

3. The package substrate of claim 1, wherein the first inductor structure includes a first solder ball.

4. The package substrate of claim 1, wherein the first and second inductor structures are configured to operate with a capacitor as a filter.

5. The package substrate of claim 4, wherein the filter is one of at least a suppression filter, and/or a $3^{rd}$ harmonic suppression filter.

6. The package substrate of claim 4, wherein the capacitor is located in an integrated device that is coupled to the package substrate.

7. The package substrate of claim 1, wherein the third interconnect is part of the second interconnect and the fifth interconnect.

8. The package substrate of claim 1, wherein the first inductor structure and the second inductor structure, individually or collectively, comprises a quality factor of about 20 or more.

9. The package substrate of claim 1, wherein the first inductor structure and the second inductor structure, individually or collectively, comprises a quality factor of about 200 or more.

10. The package substrate of claim 1, wherein the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

11. A package substrate comprising:
    at least one dielectric layer;
    a first inductive means configured to provide inductance in the package substrate;
    an interconnect means coupled to the first inductive means, the interconnect means configured to provide an electrical path for a ground signal; and
    a second inductive means configured to provide inductance in the package substrate, the second inductive means coupled to the interconnect means;
    wherein the first and second inductive means are configured to operate with a capacitive means as a filter.

12. The package substrate of claim 11, wherein the first inductive means and the second inductive means are inductive means from a plurality of inductive means in the package substrate, the plurality of inductive means arranged in an array configuration.

13. The package substrate of claim 11, wherein the filter is one of at least a suppression filter, and/or a $3^{rd}$ harmonic suppression filter.

14. The package substrate of claim 11, wherein the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

15. A printed circuit board (PCB) comprising:
    at least one dielectric layer;
    a first inductor structure at least partially located in the dielectric layer, the first inductor structure comprising:
       a first interconnect;
       a first via coupled to the first interconnect; and
       a second interconnect coupled to the first via;
    a third interconnect coupled to the first inductor structure, the third interconnect configured to provide an electrical path for a ground signal; and
    a second inductor structure at least partially located in the dielectric layer, the second inductor coupled to the third interconnect, the second inductor structure comprising:
       a fourth interconnect;
       a second via coupled to the fourth interconnect; and
       a fifth interconnect coupled to the second via.

16. The printed circuit board of claim 15, wherein the first inductor structure and the second inductor structure are inductor structures from a plurality of inductor structures in the printed circuit board (PCB), wherein the plurality of inductor structures are arranged in an array configuration.

17. The printed circuit board of claim 15, wherein the first inductor structure includes a first solder ball.

18. The printed circuit board of claim 15, wherein the first and second inductor structures are configured to operate with a capacitor as a filter.

19. The printed circuit board of claim 18, wherein the filter is one of at least a suppression filter, and/or a $3^{rd}$ harmonic suppression filter.

20. The printed circuit board of claim 18, wherein the capacitor is located in an integrated device that is coupled to the printed circuit board (PCB).

21. The printed circuit board of claim 15, wherein the third interconnect is part of the second interconnect and the fifth interconnect.

22. The printed circuit board of claim 15, wherein the first inductor structure and the second inductor structure, individually or collectively, comprises a quality factor of about 20 or more.

23. The printed circuit board of claim 15, wherein the first inductor structure and the second inductor structure, individually or collectively, comprises a quality factor of about 200 or more.

24. The printed circuit board of claim 15, wherein the printed circuit board is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

25. A printed circuit board comprising:
    at least one dielectric layer;
    a first inductive means configured to provide inductance in the printed circuit board (PCB);
    an interconnect means coupled to the first inductive means, the interconnect means configured to provide an electrical path for a ground signal; and a second inductive means configured to provide inductance in the printed circuit board (PCB), the second inductive means coupled to the interconnect means;

wherein the first and second inductive means are configured to operate with a capacitive means as a filter.

26. The printed circuit board of claim 25, wherein the first inductive means and the second inductive means are inductive means from a plurality of inductor means in the printed circuit board (PCB), wherein the plurality of inductive means are arranged in an array configuration.

27. The printed circuit board of claim 25, wherein the filter is one of at least a suppression filter, and/or a $3^{rd}$ harmonic suppression filter.

28. The printed circuit board of claim 25, wherein the printed circuit board is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *